(12) United States Patent
Higano et al.

(10) Patent No.: US 10,928,672 B2
(45) Date of Patent: Feb. 23, 2021

(54) DISPLAY DEVICE

(71) Applicant: Japan Display Inc., Minato-ku (JP)

(72) Inventors: Emi Higano, Tokyo (JP); Shigesumi Araki, Tokyo (JP); Toshiyuki Higano, Tokyo (JP)

(73) Assignee: Japan Display Inc., Minato-ku (JP)

( * ) Notice: Subject to any disclaimer, the term of this patent is extended or adjusted under 35 U.S.C. 154(b) by 248 days.

(21) Appl. No.: 15/992,474

(22) Filed: May 30, 2018

(65) Prior Publication Data

US 2018/0356683 A1    Dec. 13, 2018

(30) Foreign Application Priority Data

Jun. 7, 2017  (JP) .................. 2017-112376

(51) Int. Cl.
  *G02F 1/1335*   (2006.01)
  *G02F 1/133*    (2006.01)
  *G02F 1/1333*   (2006.01)
  *G02F 1/1343*   (2006.01)
  *G06F 3/041*    (2006.01)
  (Continued)

(52) U.S. Cl.
  CPC ...... *G02F 1/133602* (2013.01); *G02F 1/1343* (2013.01); *G02F 1/13306* (2013.01); *G06F 3/044* (2013.01); *G06F 3/0412* (2013.01); *G06F 3/0416* (2013.01); *G09G 3/3607* (2013.01); *G02F 1/13338* (2013.01); *G02F 1/13452* (2013.01); *G02F 1/13458* (2013.01); *G02F 1/133305* (2013.01); *G02F 2201/121* (2013.01); *G02F 2201/123* (2013.01); *G09G 3/3648* (2013.01); *G09G 2300/0426* (2013.01);
  (Continued)

(58) Field of Classification Search
  None
  See application file for complete search history.

(56) References Cited

U.S. PATENT DOCUMENTS

2009/0096763 A1*  4/2009  Hinata .................... G06F 3/044
                                                    345/174
2015/0138041 A1   5/2015  Hirakata et al.
                   (Continued)

FOREIGN PATENT DOCUMENTS

JP       6-301049      10/1994
JP       2015-118373    6/2015

*Primary Examiner* — Krishna P Neupane
(74) *Attorney, Agent, or Firm* — Oblon, McClelland, Maier & Neustadt, L.L.P.

(57) ABSTRACT

A display device includes: a first terminal group which is disposed on a front surface of a flexible first substrate having the front surface and is electrically connected to a plurality of pixel electrodes; a second terminal group which is disposed on a back surface of a second substrate and is electrically connected to a plurality of first electrodes of the second substrate; a display region which is disposed on each of the first substrate and the second substrate and overlaps a liquid crystal layer; and first and second peripheral regions which are disposed on the first substrate and the second substrate and located on an outer side of an adhesive. The first terminal group is formed in a first terminal arrangement region of the first peripheral region of the first substrate. The second terminal group is formed in a second terminal arrangement region of the second peripheral region of the second substrate. The first peripheral region is bent toward one side in a Z direction.

20 Claims, 16 Drawing Sheets

(51) Int. Cl.
 *G09G 3/36* (2006.01)
 *G02F 1/13357* (2006.01)
 *G06F 3/044* (2006.01)
 G02F 1/1345 (2006.01)
 H05K 3/32 (2006.01)
 H05K 1/18 (2006.01)

(52) U.S. Cl.
 CPC ............ *H05K 1/189* (2013.01); *H05K 3/323* (2013.01); *H05K 2201/10128* (2013.01)

(56) References Cited

U.S. PATENT DOCUMENTS

2016/0268542 A1* 9/2016 Suzuki ................ H01L 51/5212
2016/0293870 A1* 10/2016 Nakagawa .......... H01L 51/0097
2018/0120975 A1* 5/2018 Kim ...................... H01L 27/323

* cited by examiner

DISPLAY DEVICE

CROSS-REFERENCE TO RELATED APPLICATION

The present application claims priority from Japanese Patent Application No. 2017-112376 filed on Jun. 7, 2017, the content of which is hereby incorporated by reference into this application.

TECHNICAL FIELD OF THE INVENTION

The present invention relates to a display device, for example, a technique effectively applied to a display device in which electrodes are formed on each of substrates opposing each other.

BACKGROUND OF THE INVENTION

A technique of using a substrate having flexibility as a substrate constituting a display device has been known (see Japanese Patent Application Laid-Open Publication No. 2015-118373 (Patent Document 1)).

SUMMARY OF THE INVENTION

In the case of a display device in which electrodes are formed on each of substrates opposing each other, it is possible to integrate control circuits by electrically connecting one substrate and the other substrate. However, when the number of transmission paths for electrically connecting one substrate and the other substrate increases, it is difficult to secure a region in which such a large number of transmission paths are arranged.

An object of the invention is to provide a technique capable of improving the performance of the display device.

A display device according to an embodiment of the present invention includes: a flexible first substrate having a first A-surface; a second substrate having a second A-surface opposing the first A-surface and adhered to the first substrate via an adhesive; an electro-optical layer disposed between the first A-surface of the first substrate and the second A-surface of the second substrate; a plurality of pixel electrodes disposed between the first substrate and the electro-optical layer; a first terminal group disposed on a first A-surface side and electrically connected to the plurality of pixel electrodes; a plurality of first electrodes disposed between the second substrate and the electro-optical layer; a second terminal group disposed on a second A-surface side and electrically connected to the plurality of first electrodes; a display region disposed on each of the first substrate and the second substrate and overlapping the electro-optical layer; and a peripheral region disposed on each of the first substrate and the second substrate and located on an outer side of the electro-optical layer and the adhesive. The first terminal group is formed in a first terminal arrangement region of a first peripheral region which is the peripheral region of the first substrate. The second terminal group is formed in a second terminal arrangement region of a second peripheral region which is the peripheral region of the second substrate. The display region is disposed between the first peripheral region and the second peripheral region in a plan view, or the first peripheral region and the second peripheral region are overlapped with each other. The first substrate and the second substrate are arranged in a first direction. The first peripheral region is bent toward one side in the first direction.

BRIEF DESCRIPTIONS OF THE DRAWINGS

DESCRIPTIONS OF THE PREFERRED EMBODIMENTS

Figure 1:
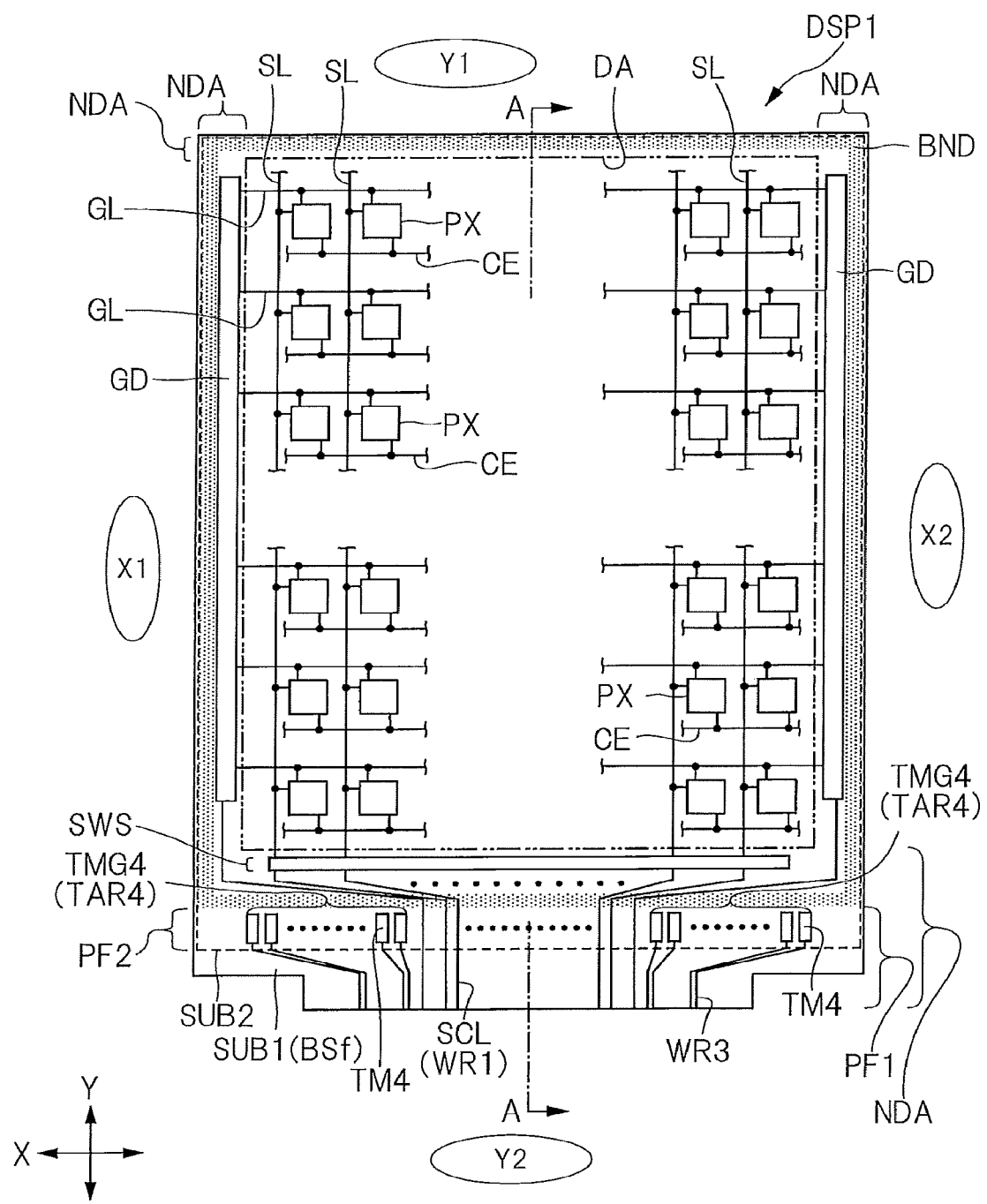
FIG. 1 is a plan view showing an example of a display device of an embodiment.

Hereinafter, each embodiment of the present invention will be described with reference to the drawings. Note that the disclosure is mere an example, and it is a matter of course that any alteration that is easily conceivable by a person skilled in the art while keeping a gist of the invention is included in the range of the present invention. In addition, a width, a thickness, a shape, and the like of each portion of the drawings are schematically illustrated in some cases as compared to actual modes in order to make the description clearer, but these are shown just by way of example, and do not limit the interpretation of the present invention. In addition, in the present specification and the respective drawings, the same or relevant reference characters are applied to the elements similar to that described in relation to the foregoing drawings, and detailed descriptions thereof will be omitted as appropriate in some cases.

In the present application, an input unit or an input device means a part or device that detects a command input from the outside as a signal. In the specification of the present application, an electrostatic capacitance detection type input unit that detects an input as a signal by using an electrostatic capacitance that varies depending on a capacitance of an object that is in proximity or contact with the electrode will be described.

In addition, a touch panel is a mode of an input unit (input device), and is an input unit that detects an input signal and further calculates and outputs a touch position, when an input operation is performed by bringing a dielectric such as a finger or a touch pen in proximity to (close to or in contact with) the touch panel. The touch position is coordinates of a position at which the input signal is detected on a coordinate plane for detecting the input signal.

An input unit (input device) that calculates the touch position such as the touch panel is often used in combination with a display unit (display device) that displays an image. An input function-equipped display device, which is composed of a display unit and an input unit each assembled from independent parts from each other and is used in a state where the display unit and the input unit are overlapped with each other, is referred to as an external type or on-cell type display device. In addition, an input function-equipped display device, which is used in a state where some or all of the parts constituting an input detection unit that detects an input signal are incorporated between parts constituting a display unit that displays an image, is referred to as a built-in type or in-cell type display device. The in-cell type display device includes a display device in which some or all of the parts constituting an input unit are shared with some or all of the parts constituting a display unit. In addition, the in-cell type display device includes a display device in which parts constituting an input unit and parts constituting a display unit are not shared with each other.

In the following embodiment, a liquid crystal display device including a liquid crystal layer which is an electro-optical layer will be described as an example of the display device. However, the technique to be described hereinafter can be applied to various modifications other than the liquid crystal display device. For example, the electro-optical layer may be a layer including an element whose optical characteristics are changed by applying electrical energy such as an organic light-emitting element layer, an inorganic light-emitting element layer, a MEMS (Micro Electro Mechanical System) shutter, or an electrophoretic element layer, other than the liquid crystal layer.

In addition, the liquid crystal display device is roughly classified into the following two modes depending on an application direction of an electric field for changing an alignment of liquid crystal molecules of the liquid crystal layer. That is, as a first classification, there is a so-called vertical electric field mode in which the electric field is applied in a thickness direction (or an out-of-plane direction) of the display device. The vertical electric field mode includes, for example, a TN (Twisted Nematic) mode, a VA (Vertical Alignment) mode, and the like. In addition, as a second classification, there is a so-called horizontal electric field mode in which the electric field is applied in a planar direction (or an in-plane direction) of the display device. The horizontal electric field mode includes, for example, an IPS (In-Plane Switching) mode, an FFS (Fringe Field Switching) mode which is one of the IPS mode, and the like. The technique to be described hereinafter can be applied to any one of the vertical electric field mode and the horizontal electric field mode, but a display device of the horizontal electric field mode is taken as an example in the embodiment to be described hereinafter.

<Configuration of Display Device>

Figure 2:
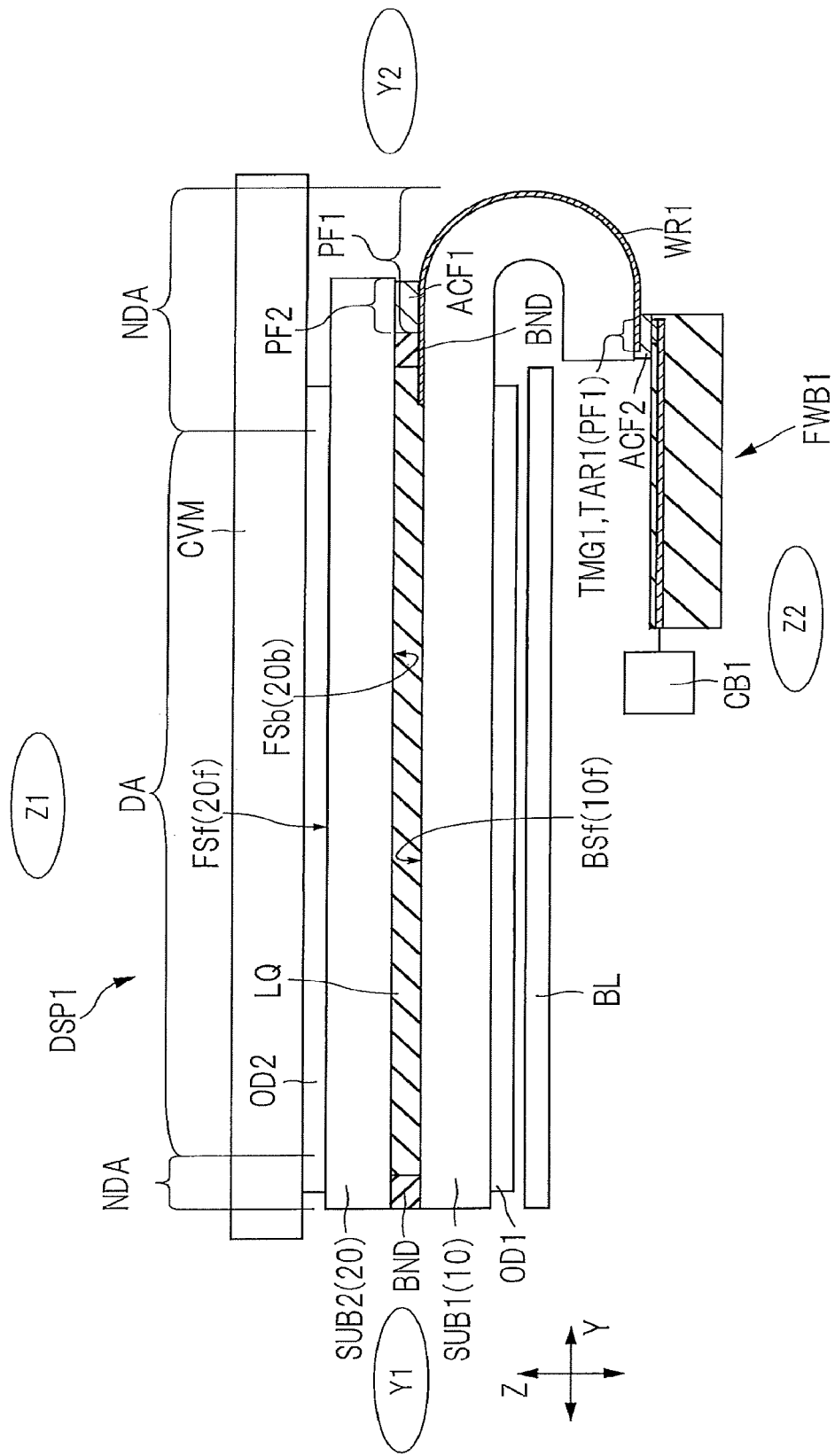
FIG. 2 is a cross-sectional view taken along a line A-A of FIG. 1.
Figure 3:
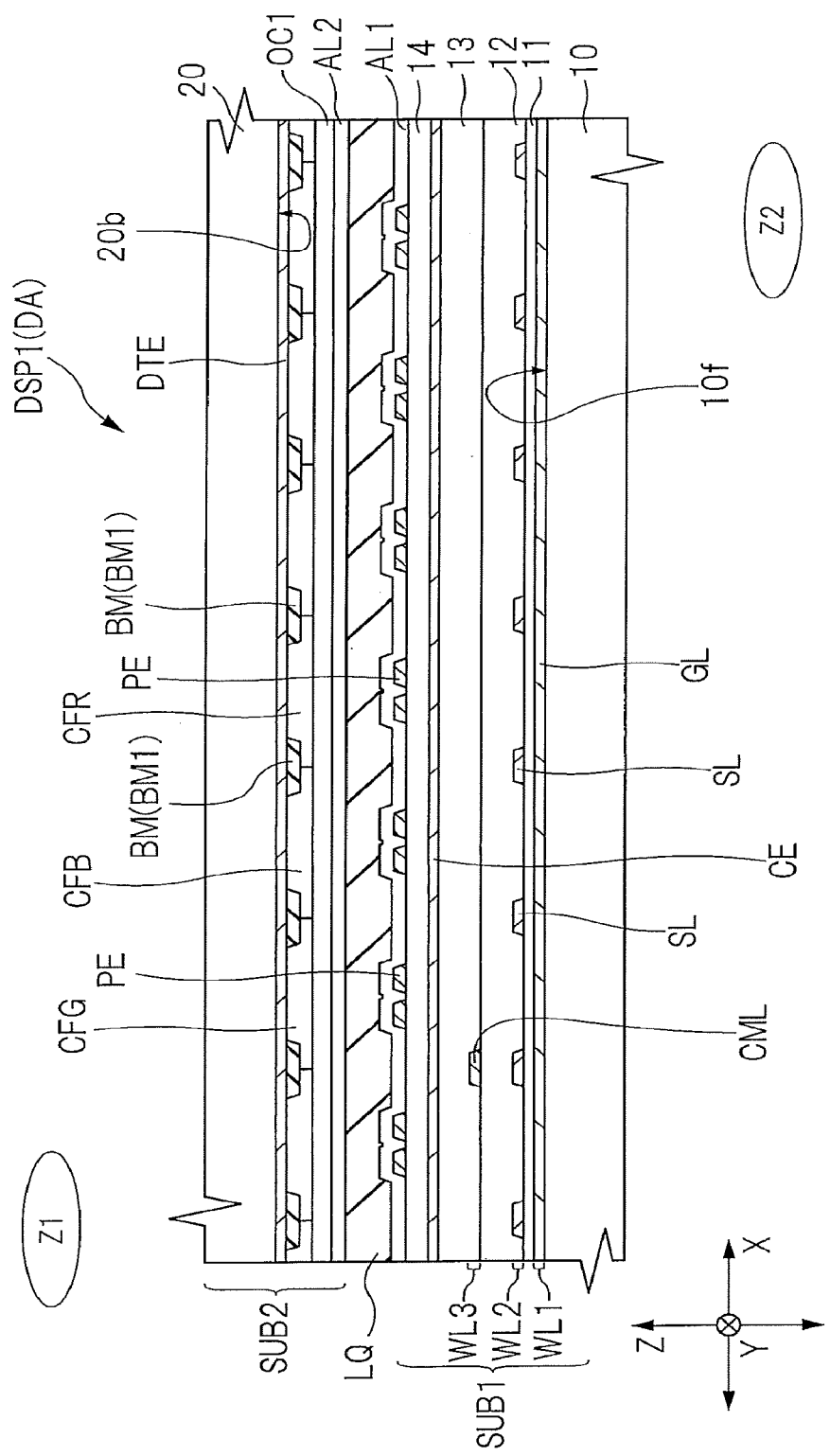
FIG. 3 is an enlarged cross-sectional view of a part of a display region of FIG. 1.
Figure 4:
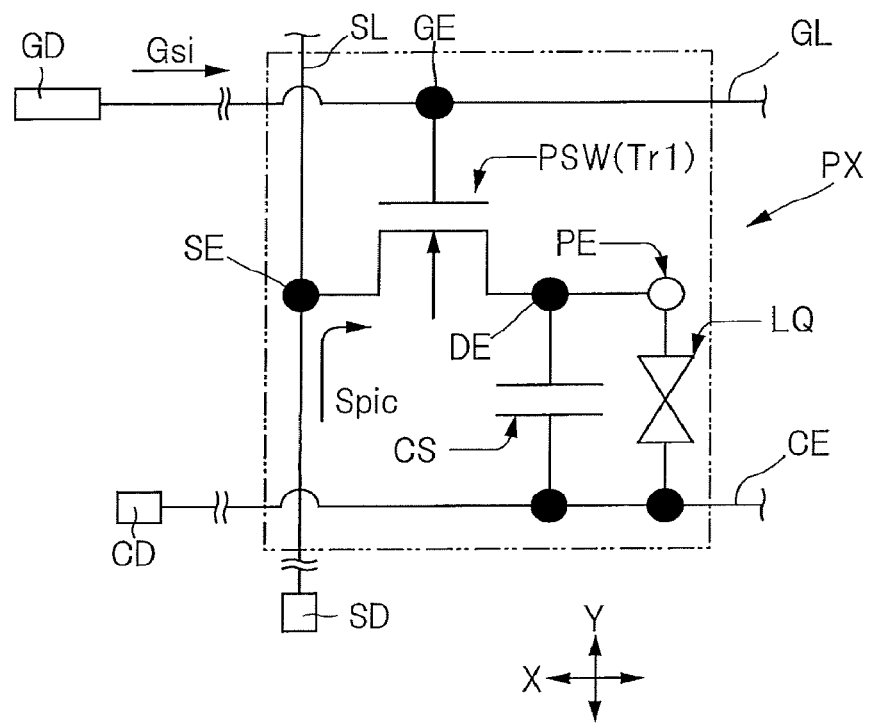
FIG. 4 is a circuit diagram showing an example of a circuit configuration around one pixel in the display device shown in FIG. 1.
Figure 5:
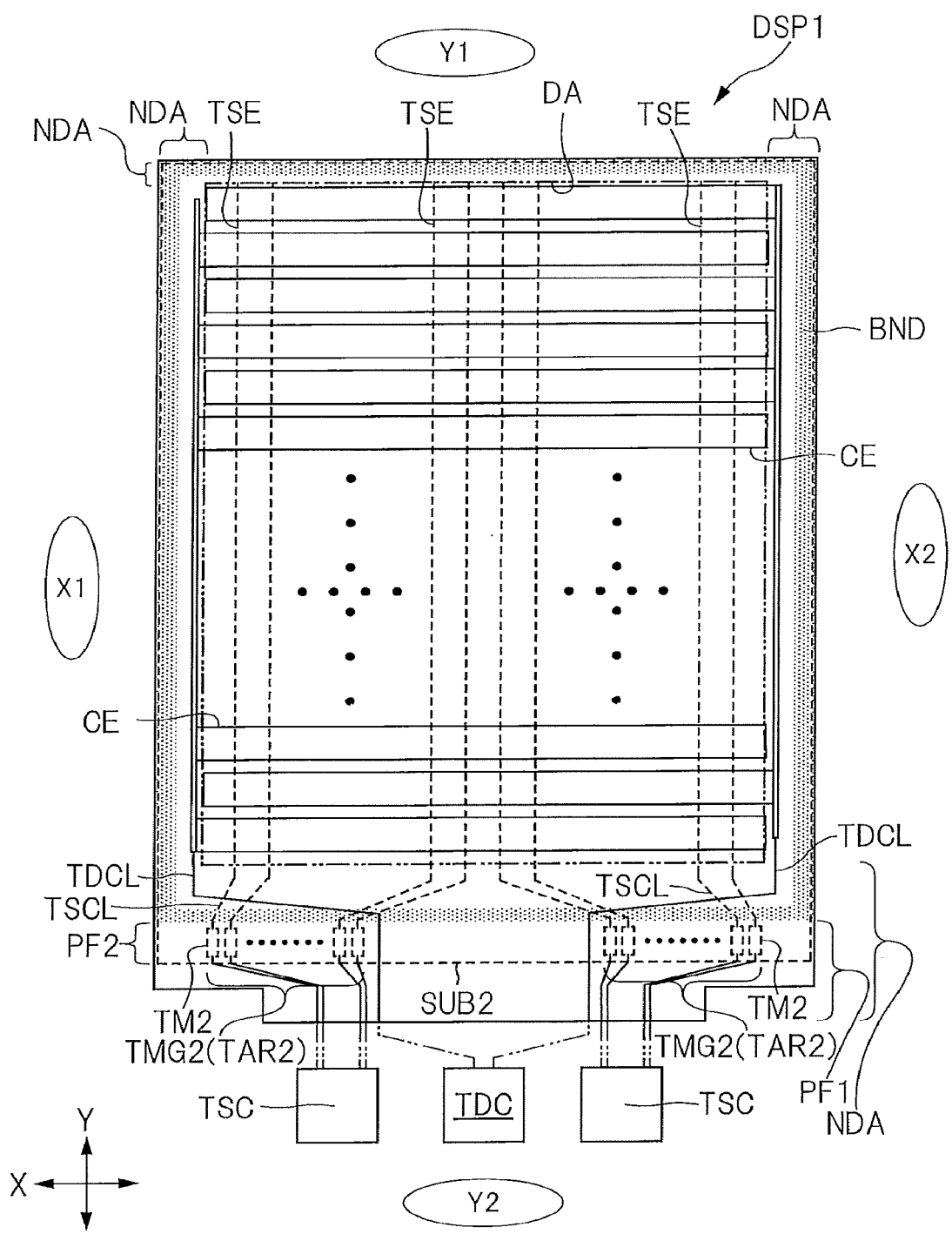
FIG. 5 is a plan view showing an example of a circuit configuration of a touch sensor provided in the display device shown in FIG. 1.

First, a configuration of a display device will be described. FIG. 1 is a plan view showing an example of the display device of the present embodiment. In FIG. 1, a boundary between a display region DA and a non-display region NDA in a plan view is indicated by a two-dot chain line. In FIG. 1, a circuit block corresponding to a display unit that displays an image and a part of wiring in a circuit provided in a display device DSP1 are schematically indicated by solid lines. Also, in FIG. 1, an outline of a substrate SUB2 arranged to oppose a substrate SUB1 is indicated by a dotted line. In addition, in FIG. 1, a dot pattern is applied to a region (seal region) where an adhesive BND is arranged in a plan view. FIG. 2 is a cross-sectional view taken along a line A-A of FIG. 1. Although FIG. 2 is a cross-sectional view, hatching is omitted except for a liquid crystal layer LQ, the adhesive BND, a wiring WR1 of the non-display region NDA, and a wiring board FWB1 for ease of viewing. FIG. 3 is an enlarged cross-sectional view of a part of the display region of FIG. 1. In FIG. 3, a scanning line GL provided in a cross section different from that in FIG. 3 is also shown in order to show an example of a positional relationship between the scanning line GL and a signal line SL in a thickness direction (Z direction in FIG. 1) of the substrate SUB1. FIG. 4 is a circuit diagram showing an example of a circuit configuration around one pixel in the display device shown in FIG. 1. FIG. 5 is a plan view showing an example of a circuit configuration of a touch sensor provided in the display device shown in FIG. 1. In FIG. 5, a boundary between the display region DA and the non-display region NDA in a plan view and a path connected to a circuit for the touch sensor are indicated by two-dot chain lines. In addition, in FIG. 5, an outline of the substrate SUB2 arranged so as to oppose the substrate SUB1 and electrodes, terminals, or wirings formed on the substrate SUB2 are indicated by dotted lines. Also, in FIGS. 1 and 5, illustration of a cover member CVM shown in FIG. 2 is omitted.

As shown in FIG. 1, the display device DSP1 of the present embodiment has the display region DA in which an image is formed according to an input signal supplied from the outside. In addition, the display device DSP1 has the non-display region (frame region) NDA provided so as to surround the periphery of the display region DA in a plan view. Although the display region DA of the display device DSP1 shown in FIG. 1 is a quadrangle, the display region DA may have a shape other than the quadrangle such as a polygon and a circle. The display region DA is an effective region in which the display device DSP1 displays an image in a plan view illustrating a display surface. Therefore, each of the substrate SUB1 and the substrate SUB2 has the display region DA.

The display device DSP1 of the present embodiment is a touch sensor-equipped display device including a display unit that displays an image according to an input signal supplied from the outside and an input unit that detects a signal input by an input operation using a finger, a touch pen, or the like. The display region DA shown in FIG. 1 serves also as a detection region of the input unit.

In addition, as shown in FIG. 2, the display device DSP1 includes the substrate SUB1 and the substrate SUB2 bonded so as to oppose each other with the liquid crystal layer LQ interposed therebetween. The substrate SUB1 and the substrate SUB2 are arranged in the Z direction which is the thickness direction of the display device DSP1. In other words, the substrate SUB1 and the substrate SUB2 oppose each other in the thickness direction of the display device DSP1 (Z direction). The substrate SUB1 has a front surface (main surface, surface) BSf opposing the liquid crystal layer LQ (and the substrate SUB2). In addition, the substrate SUB2 has a back surface (main surface, surface) FSb opposing the front surface BSf of the substrate SUB1 (and the liquid crystal layer LQ). The substrate SUB1 is an array substrate in which a plurality of transistors serving as switching elements (active elements) are arranged in an array. In addition, the substrate SUB2 is a substrate that is provided on a display surface side. The substrate SUB2 can be referred to as an opposing substrate in the meaning of a substrate arranged to oppose the array substrate.

Also, the liquid crystal layer LQ is disposed between the front surface BSf of the substrate SUB1 and the back surface FSb of the substrate SUB2. The liquid crystal layer LQ is the above-described electro-optical layer, and has a function of modulating light passing therethrough by controlling a state of an electric field formed around the liquid crystal layer LQ via the above-described switching element. The display region DA on each of the substrate SUB1 and the substrate SUB2 overlaps the liquid crystal layer LQ as shown in FIG. 2.

In addition, the substrate SUB1 and the substrate SUB2 are adhered to each other via the adhesive (sealing material) BND. As shown in FIG. 1, the adhesive BND is arranged in the non-display region NDA so as to surround the periphery of the display region DA. The liquid crystal layer LQ is disposed on the inner side of the adhesive BND as shown in FIG. 2. The adhesive BND serves a role as a sealing material that seals a portion between the substrate SUB1 and the substrate SUB2 with liquid crystal.

As shown in FIG. 2, the display device DSP1 includes an optical element OD1 and an optical element OD2. The optical element OD1 is arranged between the substrate SUB1 and a backlight unit BL. The optical element OD2 is arranged on a display surface side of the substrate SUB2, that is, on an opposite side of the substrate SUB1 with the substrate SUB2 interposed therebetween. Each of the optical element OD1 and the optical element OD2 includes at least a polarizing plate and may include a retardation plate if necessary.

Further, as shown in FIG. 2, the display device DSP1 includes the cover member CVM that covers the display surface side of the substrate SUB2. The cover member CVM opposes a front surface (surface) FSf on an opposite side of the back surface (surface) FSb of the substrate SUB2. In other words, the cover member CVM opposes a front surface (surface) 20f of a substrate 20 (see FIG. 3) on an opposite side of a back surface (surface) 20b (see FIG. 3) of the substrate 20. The substrate SUB2 (that is, the substrate 20 shown in FIG. 3) is disposed between the cover member CVM and the substrate SUB1 (that is, a substrate 10 shown in FIG. 3) in the Z direction. In other words, the cover member CVM is arranged on a Z1 side of the substrate SUB2 (that is, the substrate 20 shown in FIG. 3) in the Z direction. The cover member CVM is a protective member that protects the substrates SUB1 and SUB2 and the optical element OD2, and is arranged on the display surface side of the display device DSP1. Meanwhile, there is also a case where the cover member CVM is not provided as a modification with respect to the present embodiment.

In addition, as shown in FIG. 3, the substrate SUB1 includes the substrate (base substrate, insulating substrate) 10. Also, the substrate SUB2 includes the substrate (base substrate, insulating substrate) 20. Each of the substrate 10 and the substrate 20 has a characteristic of transmitting visible light. In addition, the substrate 10 has flexibility. As shown in FIG. 2, a peripheral region PF1 of the substrate SUB1 overlaps a peripheral region PF2 of the substrate SUB2 in a plan view. In addition, a part of the non-display region NDA is bent in the substrate SUB1. In other words, in the non-display region NDA of the substrate SUB1, the peripheral region PF1 on the outer side of the adhesive BND has a curved portion. Furthermore, the front surface BSf of the substrate SUB1 (more specifically, front surface 10f of the substrate 10) has a flat surface region and a curved surface region bent in the thickness direction (Z direction). The substrate SUB1 is flexible enough to allow the bending deformation illustrated in FIG. 2. The substrate 10 has flexibility in order to provide the substrate SUB1 with the above-described flexibility. As a constituent material of the substrate having flexibility, the substrate 10 can be made of, for example, a resin material containing polymer such as polyimide, polyamide, polycarbonate, or polyester. On the other hand, the back surface FSb of the substrate SUB2 is a flat surface and does not have a curved surface region in the example shown in FIG. 2. Thus, the substrate 20 does not necessarily have flexibility. In this case, a degree of freedom in selection for a material constituting the substrate 20 is higher than that for the material constituting the substrate 10. However, the substrate 20 also needs to have flexibility in the case where the peripheral region PF2 of the substrate SUB2 is deformed to be bent as will be described later as a modification. In this case, for example, the substrate 10 and the substrate 20 are made of the same material. It is a matter of course that the substrate 10 and the substrate 20 may be made of the same material even when the substrate SUB2 is not bent.

The substrate 10 has the front surface (main surface, surface) 10f opposing the liquid crystal layer LQ (and the substrate 20). Also, the substrate 20 has the back surface (main surface, surface) 20b opposing the front surface 10f of the substrate 10 (and the liquid crystal layer LQ). The liquid crystal layer LQ is disposed between the front surface 10f of the substrate 10 and the back surface 20b of the substrate 20.

In addition, the substrate SUB1 has a plurality of conductor patterns between the substrate 10 and the liquid crystal layer LQ. The plurality of conductor patterns between the substrate 10 and the liquid crystal layer LQ include a plurality of the scanning lines (gate lines) GL, a plurality of signal lines (source lines) SL, common lines CML, common electrodes CE, and a plurality of pixel electrodes PE. Also, an insulating film is interposed between each of the plurality of conductor patterns. The insulating films each of which is arranged between adjacent conductor patterns and insulates the conductor patterns from each other include insulating films 11, 12, 13, and 14 and an alignment film AL1. FIG. 3 shows each one of the scanning lines GL, the common electrodes CE, and the common lines CML.

The plurality of conductor patterns described above are formed in a plurality of stacked wiring layers, respectively. In the example shown in FIG. 3, the common electrode (display electrode) CE and the pixel electrode (display electrode) PE are formed in different layers, and three wiring layers WL1, WL2, and WL3 are provided in this order from the side of the substrate 10 below the layer in which the common electrode CE is formed.

As shown in FIG. 1, each of the plurality of scanning lines GL extends in an X direction. Also, the plurality of scanning lines GL are arranged at intervals in a Y direction. In other words, the plurality of scanning lines GL are arranged from a Y1 side which is one side in the Y direction toward a Y2 side which is the other side in the Y direction. Each of the plurality of scanning lines GL is led out to the non-display region NDA outside the display region DA and is connected to a scanning line drive circuit (gate drive circuit) GD. The scanning line drive circuit GD is a scanning signal output circuit that outputs a scanning signal Gsi (see FIG. 4) input to the plurality of scanning lines GL. The scanning line drive circuit GD is disposed in the non-display region NDA of the substrate SUB1.

In addition, not only the scanning line GL but also a gate electrode GE of a transistor Tr1 serving as a pixel switch element PSW shown in FIG. 4, a semiconductor layer, and the like are formed between the substrate 10 and the insulating film 11 shown in FIG. 3. The transistor Tr1 shown in FIG. 4 is a thin film transistor (TFT). In addition, the scanning line GL includes the gate electrode GE of the transistor Tr1 serving as the pixel switch element PSW.

As shown in FIG. 1, each of the plurality of signal lines (image signal lines) SL extends in the Y direction. Also, the plurality of signal lines SL are arranged at intervals in the X direction. In other words, the plurality of signal lines SL are arranged from an X1 side which is one side in the X direction toward an X2 side which is the other side in the X direction. Each of the plurality of signal lines SL is led out to the non-display region NDA outside the display region DA. As shown in FIG. 4, each of the plurality of signal lines SL is connected to the pixel electrode PE via the transistor Tr1. Specifically, the signal line SL is connected to a source electrode SE of the transistor Tr1, and the pixel electrode PE is connected to a drain electrode DE of the transistor Tr1. When the transistor Tr1 is in an On state, an image signal Spic is supplied to the pixel electrode PE from the signal line SL. The image signal Spic is supplied from a signal line drive circuit SD. As shown in FIG. 1, the signal line SL in the display region DA is electrically connected to the signal line drive circuit SD (see FIG. 4) via a signal connection wiring SCL serving as a connection wiring (also referred to as a lead-out wiring). The signal line drive circuit SD supplies the image signal Spic (see FIG. 4) to the pixel electrode PE (see FIG. 4) provided in each of a plurality of pixels PX via the signal line SL. The signal line drive circuit SD is formed on the wiring board (flexible wiring board) FWB1 or a circuit board CB1 shown in FIG. 2.

A portion (wiring portion) of the image signal line that serves as a signal transmission path connected to the signal line drive circuit SD and supplying the image signals to the plurality of pixels PX and is disposed in the display region DA is referred to as the signal line SL. Also, a portion (wiring portion) of the image signal line that is disposed outside the display region DA is referred to as the signal connection wiring SCL. Each of the plurality of signal lines SL extends in the Y direction. On the other hand, the signal connection wiring SCL has a portion extending in a direction intersecting the Y direction. In addition, in the example shown in FIG. 1, a switch circuit unit SWS is disposed between the signal line SL and the signal connection wiring SCL. The switch circuit unit SWS is, for example, a multiplexer circuit, and selects the signal line SL for each color and outputs an input signal to the selected signal line.

In addition, the common electrode CE and the pixel electrode PE (see FIG. 3) are disposed in the display region DA of the substrate SUB1. An electric field for driving liquid crystal molecules is formed depending on a potential difference between the common electrode CE and the pixel electrode PE during a display period in which the display device DSP1 displays an image. As shown in FIG. 3, the common electrode CE is formed on the insulating film 13. A drive potential common to the plurality of pixels PX (see FIG. 1) is supplied to the common electrode CE during the display period. The common drive potential is supplied from a common electrode drive circuit CD (see FIG. 4) shown in FIG. 4 via the common line CML shown in FIG. 3. The common electrode drive circuit CD is formed on the wiring board FWB1 or the circuit board CB1 shown in FIG. 2. The common electrode CE is arranged in the entire display region DA. One common electrode CE may be provided in the display region DA, or a plurality of common electrodes CE may be provided in the display region DA. The common electrode CE is preferably made of a transparent conductive material such as ITO (Indium Tin Oxide) or IZO (Indium Zinc Oxide).

Also, in the example shown in FIG. 3, the plurality of pixel electrodes PE are formed on the insulating film 14. In a plan view, each of the pixel electrodes PE is located between the two signal lines SL adjacent to each other. Also, in the example shown in FIG. 13, the common electrode CE and the pixel electrode PE are formed in different layers. As a modification, however, the plurality of common electrodes CE and the plurality of pixel electrodes PE may be formed on the same surface (for example, on the insulating film 13) and alternately arranged so as to be adjacent to each other. In addition, there is also a case where the common electrode CE is provided on the substrate SUB2. The pixel electrode PE is preferably made of, for example, a transparent conductive material such as ITO and IZO or a metal material. As described above, each of the plurality of pixel electrodes PE is electrically connected to the signal line SL and the signal connection wiring SCL via the transistor Tr1 shown in FIG. 4.

In addition, each of the plurality of pixel electrodes PE is covered with the alignment film AL1. The alignment film AL1 is an organic insulating film having a function of aligning an initial alignment of liquid crystal molecules contained in the liquid crystal layer LQ, and is made of, for example, polyimide resin. In addition, the alignment film AL1 is in contact with the liquid crystal layer LQ.

Further, the substrate SUB2 has a plurality of conductor patterns between the substrate 20 and the liquid crystal layer LQ. The plurality of conductor patterns between the substrate 20 and the liquid crystal layer LQ include a plurality of detection electrodes (electrodes) TSE (see FIG. 5). The detection electrode TSE is a member that constitutes a part of the touch sensor (input unit) provided in the display device DSP1. Each of the plurality of detection electrodes TSE constitutes a capacitive element, and the capacitance of the capacitive element changes when an input operation is performed by bringing a dielectric such as a finger or a touch pen close to a detection surface of the display device DSP1. The detection electrode TSE outputs a detection signal based on the change of the capacitance.

In the example shown in FIG. 5, the touch sensor provided in the display device DSP1 performs touch detection by utilizing capacitance changes of a plurality of capacitive elements formed in the common electrode CE and the detection electrode TSE. The plurality of common electrodes CE extending in the X direction are disposed on the substrate SUB1. On the other hand, each of the plurality of detection electrodes TSE of the substrate SUB2 extends in the Y direction. In a plan view, the plurality of detection electrodes TSE and the plurality of common electrodes CE intersect each other. In this case, each of the capacitive elements is formed at a place where the detection electrode TSE and the common electrode CE intersect each other. In addition, the common electrode CE is connected to a detection drive circuit TDC via a wiring TDCL. The detection drive circuit TDC is a circuit that supplies a drive waveform for touch detection to the common electrode CE during a detection period in which the touch detection is performed. The detection drive circuit TDC is formed on the wiring board FWB1 or the circuit board CB1 shown in FIG. 2. In addition, the detection electrode TSE is connected to the detection circuit TSC via the wiring TSCL. The detection circuit TSC is a circuit that receives a signal transmitted from the detection electrode TSE to perform data processing during the touch detection period. The detection circuit TSC is formed on the wiring board FWB1 or the circuit board CB1 shown in FIG. 2.

Also, as shown in FIG. 3, the substrate SUB2 includes a light-shielding film BM, color filters CFR, CFG, and CFB, an insulating film OC1, and an alignment film AL2, which are disposed between the liquid crystal layer LQ and the back surface (main surface, surface) 20b of the substrate 20 opposing the substrate SUB1. In the example shown in FIG. 3, the detection electrode TSE is disposed between the light-shielding film BM and the substrate 20.

The color filters CFR, CFG, and CFB are formed on the back surface 20b side opposing the substrate SUB1. In the example shown in FIG. 3, the color filters CFR, CFG, and CFB of three colors of red (R), green (G), and blue (B) are periodically arranged. For example, the pixels of three color of red (R), green (G), and blue (B) are used as one set to display a color image in a color display device. The plurality of color filters CFR, CFG, and CFB of the substrate SUB2 are arranged at positions opposing the respective pixels PX (see FIG. 1) having the pixel electrodes PE formed on the substrate SUB1. Note that the types of the color filters are not limited to the three colors of red (R), green (G), and blue (B).

In addition, the light-shielding film BM is formed at each boundary among the color filters CFR, CFG, and CFB of the respective colors. The light-shielding film BM is referred to as a black matrix, and is made of, for example, black resin or metal with low reflectivity. The light-shielding film BM is formed in, for example, a grid shape when seen in a plan view. In other words, the light-shielding film BM extends in the X direction and the Y direction. Specifically, the light-shielding film BM has a plurality of portions extending in the Y direction and a plurality of portions extending in the X direction intersecting the Y direction. It is possible to suppress the leakage of light and the mixing of colors by partitioning the respective pixels PX with the black matrix.

In addition, the light-shielding film BM is formed in the non-display region NDA of the substrate SUB2. The non-display region NDA overlaps the light-shielding film BM. The display region DA is defined as a region on an inner side of the non-display region NDA. Also, the non-display region NDA is a region overlapping the light-shielding film BM that shields light emitted from the backlight unit (light source) BL shown in FIG. 2. Although the light-shielding film BM is formed also in the display region DA, a plurality of openings are formed in the light-shielding film BM in the display region DA. In general, an end portion of the opening formed on a side closest to a peripheral edge portion among the openings which are formed in the light-shielding film BM and through which the color filters are exposed is defined as the boundary between the display region DA and the non-display region NDA.

In addition, the insulating film OC1 shown in FIG. 3 covers the color filters CFR, CFG, and CFB. The insulating film OC1 functions as a protective film that prevents impurities from being diffused from the color filters to the liquid crystal layer. The insulating film OC1 is an organic insulating film made of, for example, acrylic photosensitive resin or the like.

<Wiring Layout>

Figure 6:
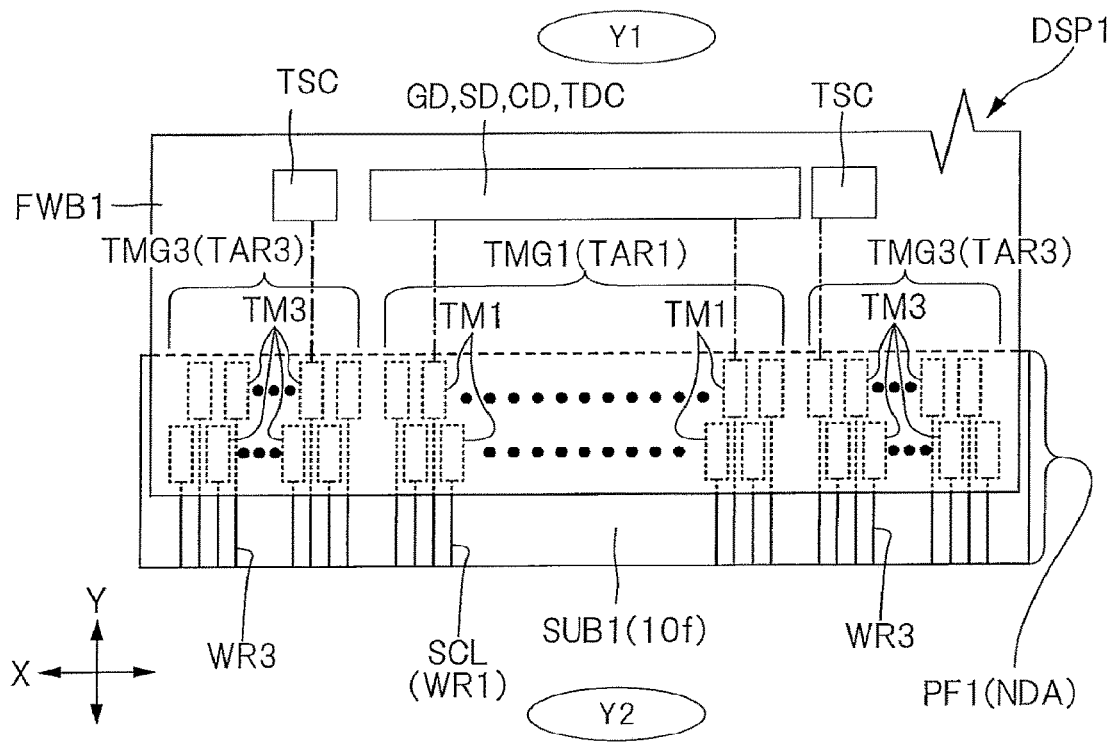
FIG. 6 is an enlarged plan view showing the periphery of a region where a substrate and a wiring board shown in FIG. 2 are connected in an enlarged manner.
Figure 7:
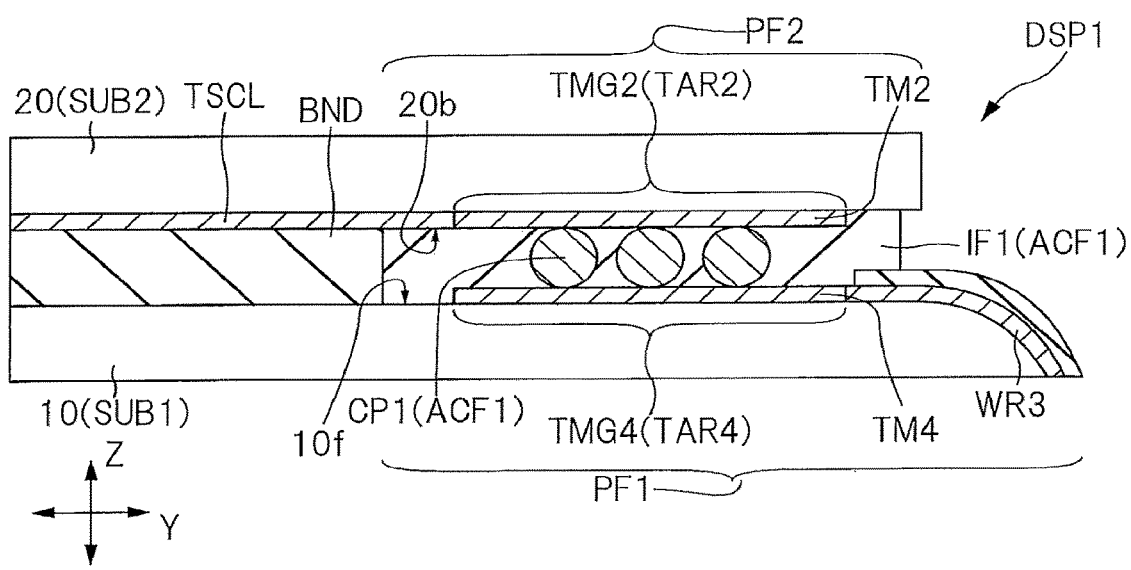
FIG. 7 is an enlarged cross-sectional view showing an example of a connection structure of two substrates shown in FIG. 5.
Figure 18:
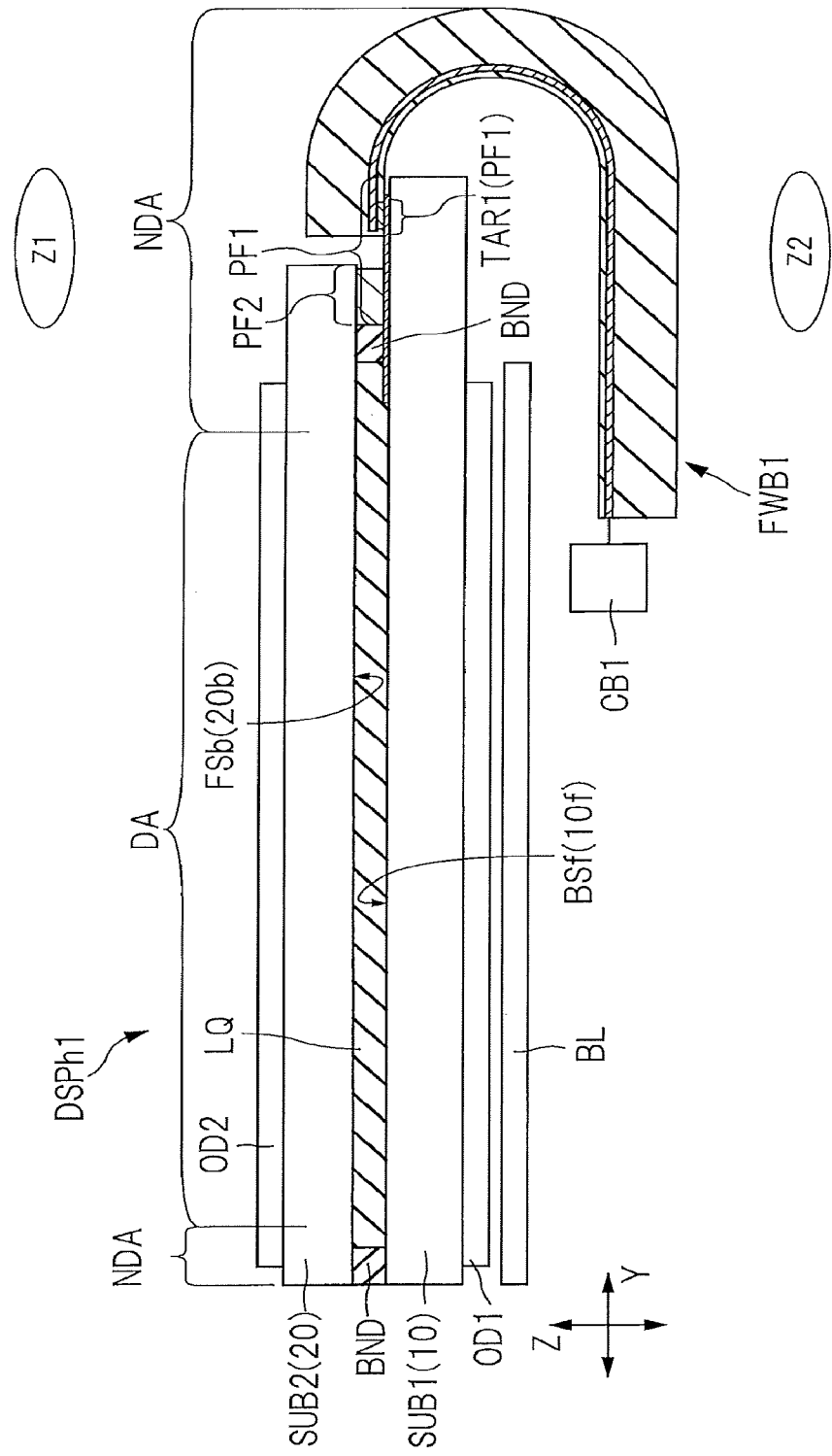
FIG. 18 is a cross-sectional view of a display device which is a comparative example with respect to FIG. 2.

Next, a layout of wirings that electrically connect various electrodes formed in the display region DA of the substrate SUB1 and the substrate SUB2 and circuits formed outside the display region DA will be described. FIG. 6 is an enlarged plan view showing the periphery of a region where the substrate and the wiring board shown in FIG. 2 are connected in an enlarged manner. FIG. 7 is an enlarged cross-sectional view showing an example of a connection structure of the two substrates shown in FIG. 5. FIG. 18 is a cross-sectional view of a display device which is a comparative example with respect to FIG. 2.

Each of the various electrodes arranged in the display region DA is electrically connected to a drive circuit and a control circuit. These drive circuit and control circuit are formed outside the display region DA. For example, in the case of the display device DSP1, the drive circuit and the control circuit are formed on the wiring board FWB1 or the circuit board CB1 shown in FIG. 2. Thus, terminals that function as external terminals of the substrates SUB1 and SUB2 are formed on each of the substrate SUB1 and the substrate SUB2. These terminals are formed in peripheral regions PF1 and PF2 on the outer side of the liquid crystal layer LQ and the adhesive BND, in the non-display region NDA shown in FIGS. 1 and 5.

As shown in FIG. 6, the substrate SUB1 has a terminal group TMG1 including a plurality of terminals TM1. The plurality of terminals TM1 constituting the terminal group TMG1 include an image signal terminal connected to the pixel electrode PE shown in FIG. 3. In addition, the plurality of terminals TM1 include a common electrode drive signal terminal connected to the common electrode CE shown in FIG. 3. Also, the plurality of terminals TM1 include a scanning line drive signal terminal connected to the scanning line GL shown in FIG. 1. The terminal group TMG1 is arranged in a terminal arrangement region TART of the peripheral region PF1 of the substrate SUB1.

Each of the plurality of terminals am is connected to the pixel electrode PE or the common electrode CE shown in FIG. 3, or the scanning line GL shown in FIG. 1 via the wiring WR1 formed on the substrate SUB1. The wiring WR1 includes the signal connection wiring SCL connected to the signal line SL shown in FIG. 1. In addition, as schematically shown in FIG. 6, the plurality of terminals TM1 are connected to any of the scanning line drive circuit GD, the signal line drive circuit SD, the common electrode drive circuit CD, and the detection drive circuit TDC.

Also, the substrate SUB1 has a terminal group TMG3 including a plurality of terminals TM3. The terminal group TMG3 is arranged in a terminal arrangement region TAR3 in the peripheral region PF1 of the substrate SUB1. Each of the plurality of terminals TM3 constituting the terminal group TMG3 is electrically connected to the detection electrode TSE formed on the substrate SUB2. Specifically, as shown in FIG. 1, the terminal TM3 of the substrate SUB1 is electrically connected to a terminal TM4 of the substrate SUB1 shown in FIG. 1 via a wiring WR3 of the substrate SUB1. A terminal group TMG4 including a plurality of terminals TM4 is disposed in a terminal arrangement region TAR4 opposing the peripheral region PF2 of the substrate SUB2 (specifically, terminal arrangement region TAR2 shown in FIG. 5), in the peripheral region PF1 of the substrate SUB1. In addition, the terminal TM4 is electrically connected to a terminal TM2 of the substrate SUB2 shown in FIG. 5 via an anisotropic conductive film ACF1 (see FIG. 7) which is a conductive member. A terminal group TMG2 including a plurality of terminals TM2 is arranged in the terminal arrangement region TAR2 in the peripheral region PF2 of the substrate SUB2. The terminal group TMG2 is electrically connected to the detection electrode TSE via a wiring WR2. Further, as schematically shown in FIG. 6, the plurality of terminals TM3 are connected to the detection circuit TSC.

When each of the plurality of detection electrodes TSC formed on the substrate SUB2 is connected to the terminal TM3 of the substrate SUB1 as in the present embodiment, the wiring board FWB1 is not necessarily connected to each of the substrate SUB1 and the substrate SUB2. Thus, it is possible to reduce the number of parts constituting the display device DSP1.

Although not shown, a structure in which a semiconductor chip including the scanning line drive circuit GD and the signal line drive circuit SD is mounted on the substrate SUB1 is also conceivable as a comparative example with respect to the display device DSP1. In the case of the display device DSP1, no semiconductor chip is mounted on the substrate SUB1, and the scanning line drive circuit GD and the signal line drive circuit SD are formed on the wiring board FWB1 or the circuit board CB1 shown in FIG. 2. Thus, it is not necessary to provide a space for mounting the semiconductor chip in the peripheral region PF1 of the substrate SUB1 in the case of the display device DSP1. As a result, the display device DSP1 can reduce the area of the peripheral region in a plan view.

However, in the case of the display device DSP1, it is necessary to provide spaces for arranging the terminal group TMG4 (see FIG. 1) and the terminal group TMG2 (see FIG. 5) which electrically connect the substrate SUB1 and the substrate SUB2. As shown in FIG. 1, a large number of wirings are arranged at a high density inside a region surrounded by the adhesive BND, and it is thus difficult to secure the space for arranging the terminal group TMG4. Therefore, in the case of the display device DSP1, the terminal group TMG4 is arranged in the peripheral region PF1 on the outer side of the adhesive BND. In addition, as shown in FIG. 5, the terminal group TMG2 is arranged in the peripheral region PF2 on the outer side of the adhesive BND in the case of the display device DSP1.

Also, as shown in FIG. 2, the peripheral region PF1 is bent toward one side in the Z direction (Z2 side corresponding to the opposite side of the display surface in the example shown in FIG. 2). In addition, the terminal arrangement region TAR1 faces a direction different from the front surface 10f (see FIG. 3) in the display region DA of the substrate 10 (see FIG. 3). In the example of the present embodiment, the front surface 10f in the display region DA of the substrate 10 faces the Z1 side in the Z direction as shown in FIG. 3. On the other hand, the terminal arrangement region TAR1 shown in FIG. 2 faces the Z2 side which is the side opposite to the Z1 side. When the substrate SUB1 itself is bent and the terminal arrangement region TAR1 and the display region DA face different directions on the front surface BSf side of the substrate SUB1 as described above, it is possible to reduce the area of the non-display region NDA including the peripheral region PF1 in a plan view.

For example, in the example shown in FIG. 2, the terminal arrangement region TAR1 and the substrate SUB2 are overlapped with each other in the thickness direction of the display device DSP1 (Z direction). When the terminal arrangement region TAR1 and the display region DA are present on the same plane, it is difficult to overlap the terminal arrangement region TAR1 and the substrate SUB2 with each other in order to avoid mutual interference between the wiring board FWB1 and the substrate SUB2. Since the terminal arrangement region TAR1 does not oppose the substrate SUB2 in the case of the display device DSP1, it is possible to prevent the interference between the substrate SUB2 and the wiring board FWB1 even when the terminal arrangement region TAR1 and the substrate SUB2 are overlapped with each other.

In addition, in the case of the display device DSP1, the substrate SUB1 is bent toward the Z2 side in the Z direction on the Y1 side in the Y direction. In addition, a part of the peripheral region PF1 is folded back so as to extend toward the Y1 side in the Y direction on the Z2 side of the backlight unit BL. In this case, it is necessary to provide a space for bending the substrate SUB1 inside the non-display region NDA in a plan view. However, when the substrate SUB1 is not bent as in a display device DSPh1 of the comparative example shown in FIG. 18, it is necessary to bend the wiring board FWB1 in order to connect the circuit board CB1 arranged on the Z2 side of the substrate SUB1 and the wiring board FWB1. In addition, it is necessary to bend the wiring board FWB1 so as to enfold the substrate SUB1 when bending the wiring board FWB1. Thus, the space required for folding the wiring board FWB1 is larger than the space required for folding the substrate SUB1 shown in FIG. 2. In other words, since the substrate SUB1 itself is bent in the case of the display device DSP1, it is possible to reduce the space for folding.

In addition, as shown in FIG. 2, the wiring board FWB1 overlaps the display region DA. In the example shown in FIG. 2, the circuit board CB1 overlaps the display region DA. However, each of the wiring board FWB1 and the circuit board CB1 is arranged on the Z2 side of the backlight unit BL. The backlight unit (light source unit) BL functions as a light source that emits light toward the display surface side (substrate SUB1 side). There are various modes for the method of supplying light by the backlight unit BL, and there is no particular limitation. For example, the method in which a light guide plate is provided in a region overlapping the display region DA and light supplied from a light emitting element arranged around the light guide plate is reflected toward the display surface side is applicable. Also, for example, the method in which a light emitting element is arranged in a region overlapping the display region DA and light is supplied from the light emitting element toward the display surface side is also applicable. In addition, for example, the method in which a reflecting plate that reflects visible light is arranged in the backlight unit BL and the reflected light is supplied toward the display surface side is also applicable.

When an image is displayed by light supplied from the backlight unit BL toward the display surface side as in the display device DSP1, there is no influence on the quality of the displayed image even if a member arranged on the back surface side (Z2 side in FIG. 2) of the backlight unit BL is formed of an opaque material that does not transmit visible light. Namely, the wiring board FWB1 and the circuit board CB1 may be arranged in a region overlapping the display region DA. In addition, the wiring board FWB1 and the circuit board CB1 have a high degree of freedom in material selection. For example, the wiring board FWB1 includes a plurality of wirings containing metal and an insulating material that insulates each of the plurality of wirings. Since it is not necessary to consider the transmissivity of visible light when selecting the insulating material, it is possible to select a material preferable in terms of characteristics such as durability and flexibility.

In addition, as shown in FIG. 7, the peripheral region PF1 of the substrate SUB1 and the peripheral region PF2 of the substrate SUB2 oppose each other in the case of the display device DSP1. Specifically, the peripheral region PF2 of the substrate SUB2 opposes a part of the peripheral region PF1. In addition, each of the terminal arrangement region TAR2 and the terminal arrangement region TAR4 is present in a region where the substrate SUB1 and the substrate SUB2 oppose each other. As a result, the terminal group TMG2 and the terminal group TMG4 can be electrically connected via the anisotropic conductive film ACF1. The anisotropic conductive film ACF1 includes a plurality of conductive particles CP1 and an insulating film IF1 around the plurality of conductive particles CP1. In other words, the anisotropic conductive film ACF1 is the insulating film IF1 containing the plurality of conductive particles CP1. The anisotropic conductive film ACF1 adheres to both the front surface $10f$ of the substrate 10 and the back surface $20b$ of the substrate 20. In addition, the conductive particle CP1 is in contact with both the terminal TM2 and the terminal TM4. Thus, the terminals TM2 and TM4 are electrically connected via one or more conductive particles CP1. When the terminal TM4 of the substrate SUB1 and the terminal TM2 of the substrate SUB2 are connected via the anisotropic conductive film ACF1, it is possible to simplify the connection structure between the substrates. In addition, in the case of using the anisotropic conductive film ACF1, it is possible to connect the plurality of terminals TM4 shown in FIG. 1 and the plurality of terminals TM2 shown in FIG. 5 at once, and it is thus possible to improve the efficiency of a manufacturing process.

In addition, as shown in FIG. 2, the terminal group TMG1 and terminals of the wiring board FWB1 are electrically connected via an anisotropic conductive film ACF2. In addition, the terminal group TMG3 shown in FIG. 6 is electrically connected to the wiring board FWB1 via the anisotropic conductive film ACF2 shown in FIG. 2. The anisotropic conductive film ACF2 includes the plurality of conductive particles CP1 and the insulating film IF1 around the plurality of conductive particles CP1 like the anisotropic conductive film ACF1 shown in FIG. 7. In other words, the anisotropic conductive film ACF2 is the insulating film IF1 containing the plurality of conductive particles CP1. Since the plurality of terminal groups TMG1 and TMG3 formed on the substrate SUB1 and the terminals of the wiring board FWB1 are electrically connected via the anisotropic conductive film ACF2, it is possible to easily connect the substrate SUB1 and the wiring board FWB1.

In addition, as shown in FIG. 5, the plurality of detection electrodes TSE are arranged at equal intervals in the display region DA. On the other hand, the terminal group TMG2 connected to the detection electrodes TSE is integrally arranged on each of the X1 side and the X2 side in the X direction of the peripheral region PF2. The display region DA and the peripheral region PF2 of the substrate SUB2 are arranged in the Y direction. A length of the terminal arrangement region TAR2 is shorter than a length of the display region DA in the X direction intersecting the Y direction. The peripheral region PF2 has an X1-side region, an X2-side region opposite to the X1-side region, and a central region between the X1-side region and the X2-side region in the X direction. The terminal arrangement region TAR2 is disposed in the X1-side region in the X direction. Also, in the example shown in FIG. 5, the terminal arrangement region TAR2 is disposed in the X2-side region in the X direction. In addition, the terminal group TMG2 is not arranged in the central region between the terminal arrangement region TAR2 in the X1-side region and the terminal arrangement region TAR2 in the X2-side region.

As described above, the terminal group TMG2 shown in FIG. 5 and the terminal group TMG4 shown in FIG. 1 are arranged so as to oppose each other. Accordingly, the terminal group TMG4 connected to the terminal group TMG2 (see FIG. 5) is integrally arranged on each of the X1 side and the X2 side in the X direction of the peripheral region PF1. As shown in FIG. 1, the display region DA and the peripheral region PF1 of the substrate SUB1 are arranged in the Y direction. A length of the terminal arrangement region TAR4 is shorter than a length of the display region DA in the X direction intersecting the Y direction. The peripheral region PF1 has an X1-side region, an X2-side region opposite to the X1-side region, and a central region between the X1-side region and the X2-side region in the X direction. The terminal arrangement region TAR4 is disposed in the X1-side region in the X direction. Also, in the example shown in FIG. 5, the terminal arrangement region TAR4 is disposed in the X2-side region in the X direction. In addition, the wiring WR1 including the plurality of signal connection wirings SCL connected to the pixel electrodes PE (see FIG. 4) is arranged in the central region between the terminal arrangement region TAR4 in the X1-side region and the terminal arrangement region TAR4 in the X2-side region.

In the case of the display device DSP1, the plurality of signal connection wirings SCL (see FIG. 1) connected to the pixel electrodes PE (see FIG. 4) and the terminal group TMG2 connected to the plurality of detection electrodes TSE (see FIG. 5) are not overlapped with each other in a region where the peripheral region PF1 and the peripheral region PF2 are overlapped with each other. Thus, when the terminal TM2 and the terminal TM4 are connected via the anisotropic conductive film ACF1 as shown in FIG. 7, it is possible to prevent the plurality of signal connection wirings SCL shown in FIG. 1 and the terminal TM2 shown in FIG. 5 from being short-circuited.

In addition, as described above, the wiring WR1 including the plurality of signal connection wirings SCL is integrated in the central region between the terminal arrangement region TAR4 in the X1-side region and the terminal arrangement region TAR4 in the X2-side region in the X direction shown in FIG. 1. Thus, the following arrangement is provided in a region connected to the wiring board FWB1 shown in FIG. 6. That is, a length of the terminal arrangement region TAR1 is shorter than a length of the display region DA (see FIG. 1) in the X direction. The peripheral region PF1 has an X1-side region, an X2-side region opposite to the X1-side region, and a central region between the X1-side region and the X2-side region in the X direction. The terminal arrangement region TAR1 is disposed in the central region between the X1-side region and the X2-side region. In addition, the terminal arrangement region TAR3 is disposed in the X1-side region and the Z2-side region. As a result, it is possible to suppress a three-dimensional intersection between a signal transmission path connected to the pixel electrode PE (see FIG. 4) and a transmission path connected to the detection electrode TSE (see FIG. 5). Thus, it is possible to reduce crosstalk noise between the signal transmission paths.

<Modification 1>

Figure 8:
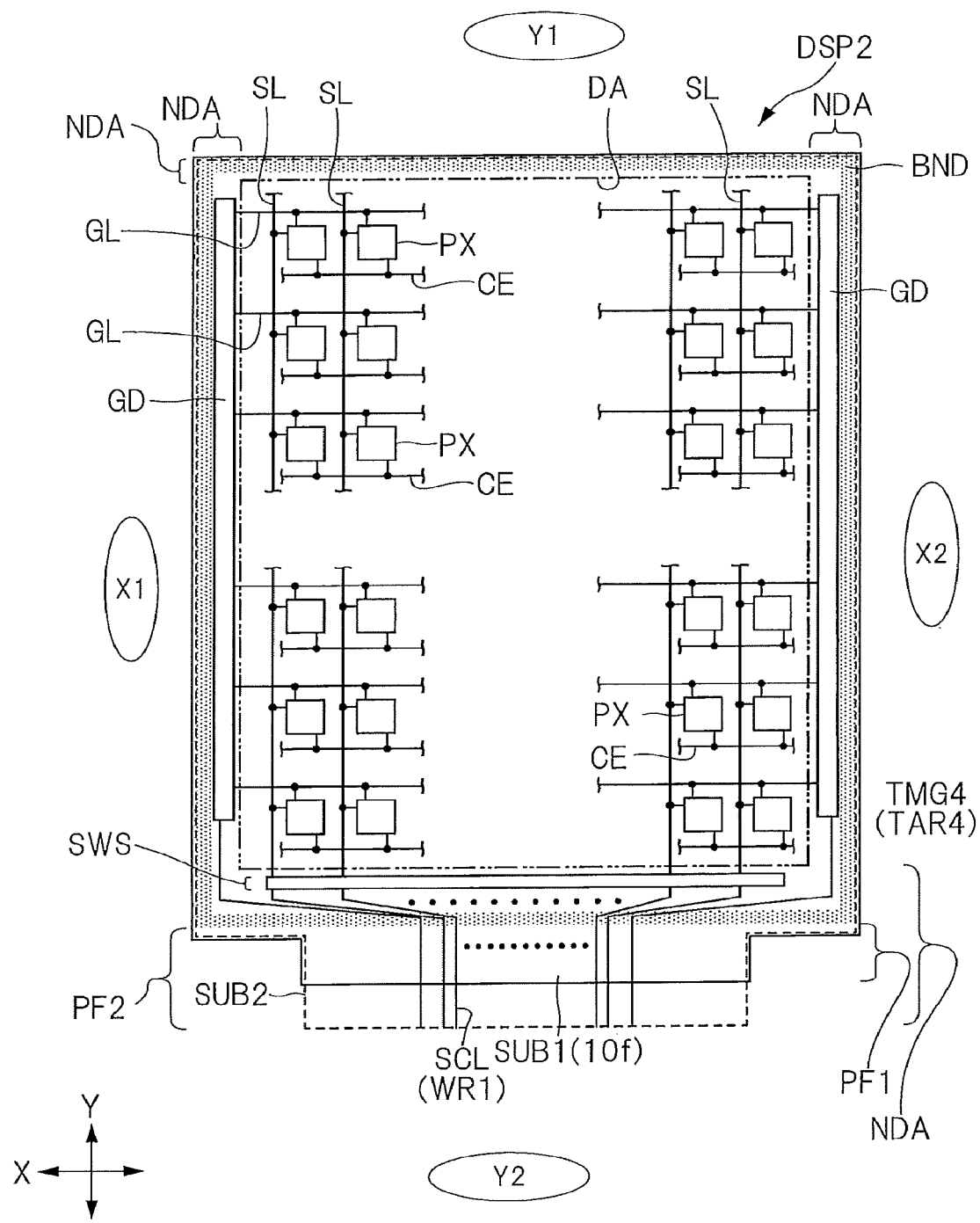
FIG. 8 is a plan view of a display device which is a modification with respect to FIG. 1.
Figure 9:
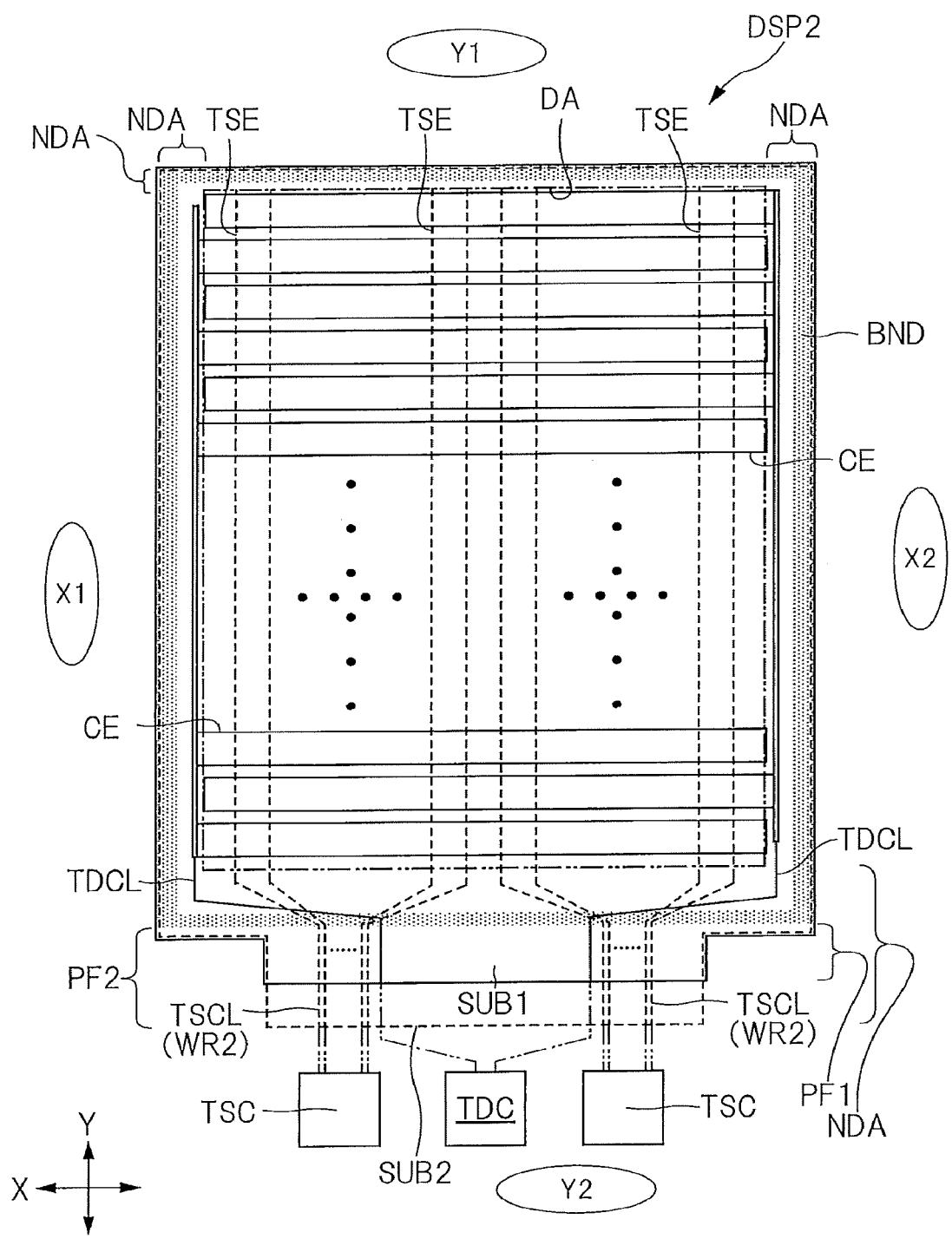
FIG. 9 is a plan view showing an example of a circuit configuration of a touch sensor provided in the display device shown in FIG. 8.
Figure 10:
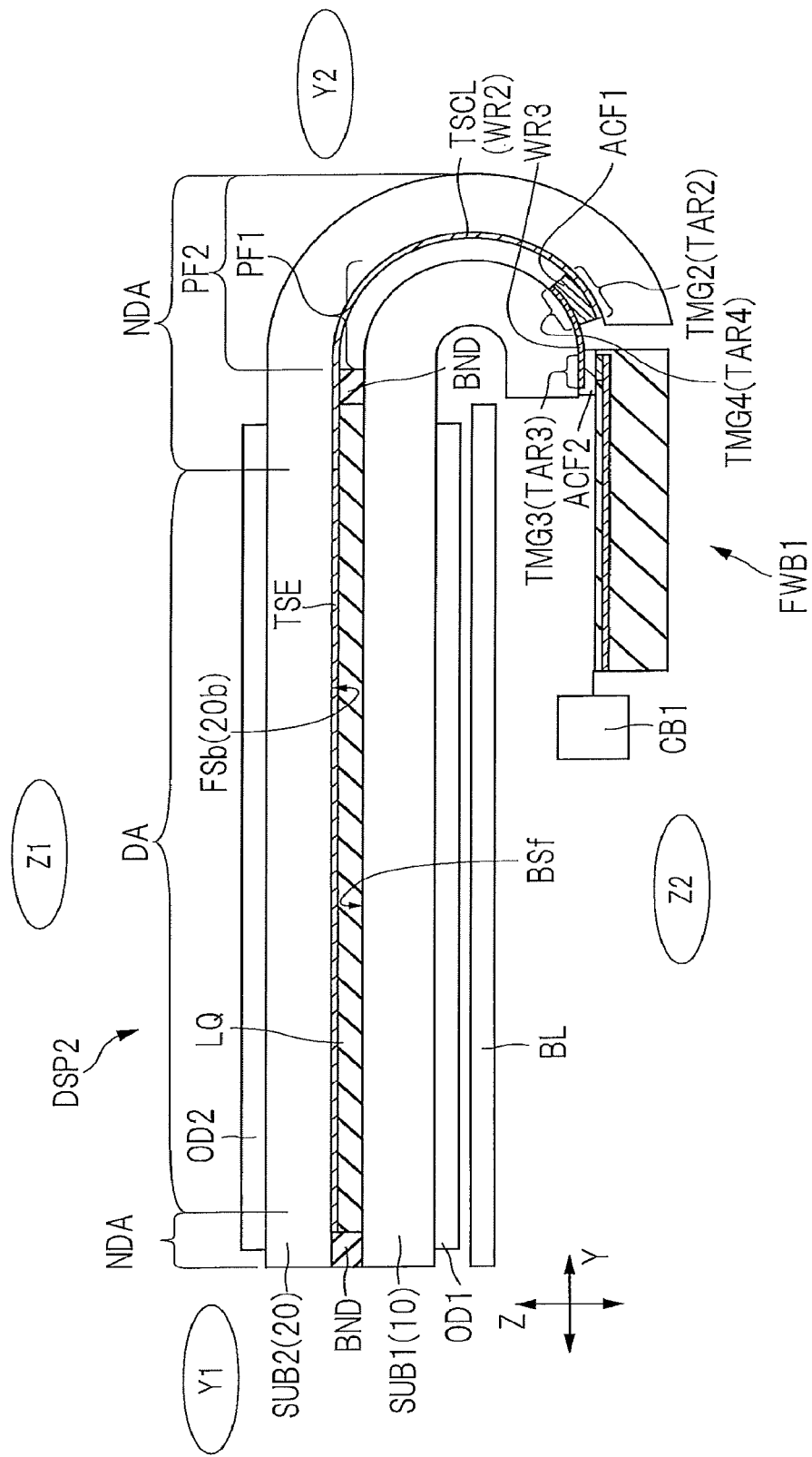
FIG. 10 is a cross-sectional view of a detection electrode and a wiring connected to the detection electrode shown in FIG. 9 taken along a wiring path.
Figure 11:
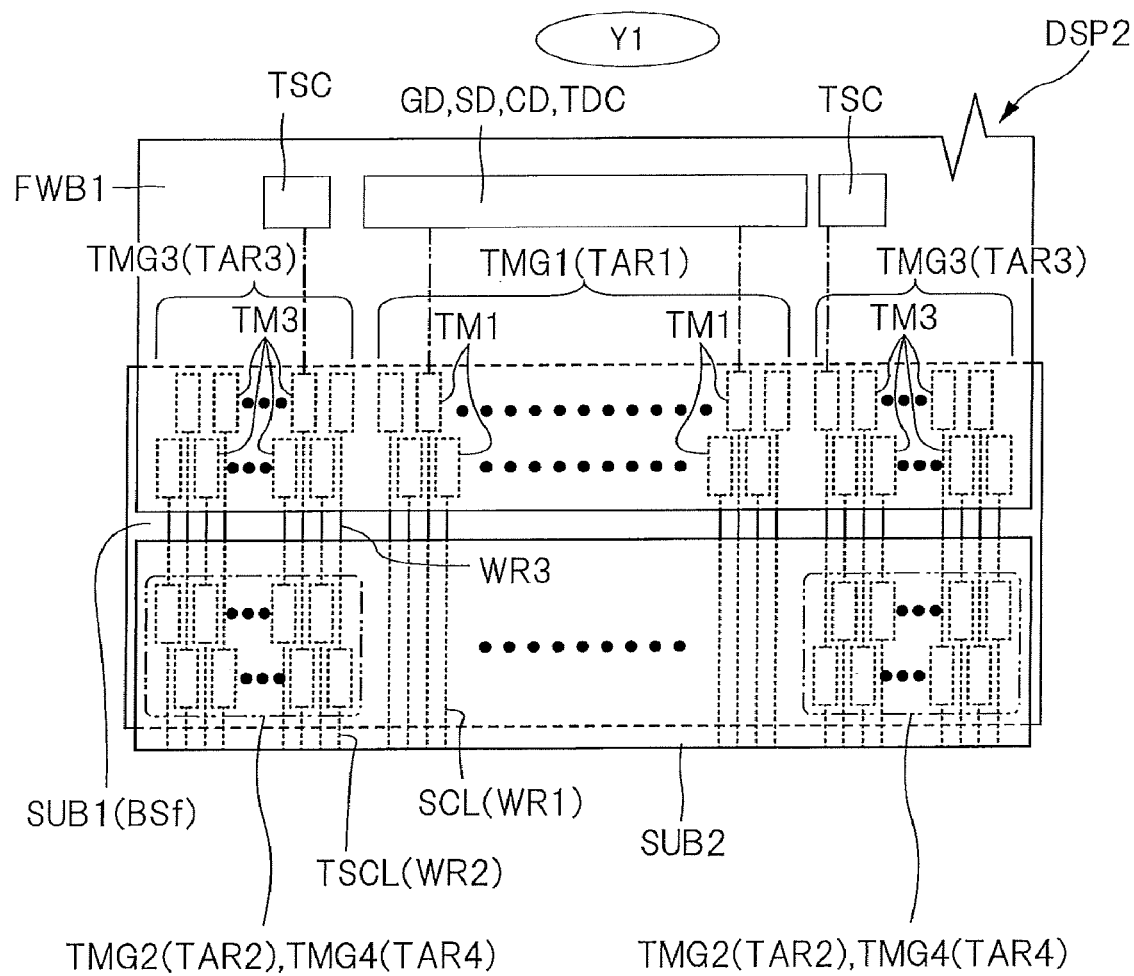
FIG. 11 is an enlarged plan view showing the periphery of a region where a substrate and a wiring board shown in FIG. 8 are connected in an enlarged manner.

Next, various modifications of the above-described display device DSP1 will be sequentially described. FIG. 8 is a plan view of a display device which is a modification with respect to FIG. 1. FIG. 9 is a plan view showing an example of a circuit configuration of a touch sensor provided in the display device shown in FIG. 8. Also, FIG. 10 is a cross-sectional view of a detection electrode and a wiring connected to the detection electrode shown in FIG. 9 taken along a wiring path. FIG. 11 is an enlarged plan view showing the periphery of a region where a substrate and a wiring board shown in FIG. 8 are connected in an enlarged manner.

A display device DSP2 shown in FIGS. 8 to 11 is different from the display device DSP1 shown in FIG. 2 in that each of the substrate SUB1 and the substrate SUB2 is bent as shown in FIG. 10. The substrate 20 of the substrate SUB2 is a flexible substrate like the substrate 10. Also, the peripheral region PF2 of the substrate SUB2 is bent toward the Z2 side in the Z direction on the Y2 side in the Y direction. In addition, the terminal arrangement region TAR2 in which the terminal group TMG2 of the substrate SUB2 is arranged faces a direction different from the back surface 20b of the substrate SUB2 in the display region DA. In the example shown in FIG. 10, the terminal arrangement region TAR2 is in the curved surface region of the substrate SUB2, and the terminal arrangement region TAR4 is in the curved surface region of the substrate SUB1.

When the substrate SUB1 and the substrate SUB2 are bent as in the display device DSP2, a space for bending the peripheral region PF1 and a space for bending the peripheral region PF2 need to be provided in the non-display region NDA.

However, as shown in FIGS. 8 and 9, the terminal group TMG4 (see FIG. 8) and the terminal group TMG2 (see FIG. 9) are not arranged in the vicinity of the display region DA (that is, in the vicinity of the adhesive BND) in the case of the display device DSP2. As shown in FIG. 11, the terminal group TMG4 and the terminal group TMG2 are arranged so as to oppose each other in the vicinity of the terminal group TMG3. In addition, a layout of wirings of the display device DSP2 can be expressed as follows by using the wiring WR2 that electrically connects the detection electrode TSE and the terminal group TMG2 shown in FIG. 10 and a wiring WR3 that connects the terminal group TMG4 and the terminal group TMG3. That is, a path distance from a portion of the wiring WR2 overlapping the adhesive BND to the terminal group TMG2 is longer than a path distance of the wiring WR3.

Since no terminal group is arranged in the vicinity of the adhesive BND in the display device DSP2, it is possible to simplify the wiring layout in the vicinity of the adhesive BND. As a result, as can be seen from the comparison between FIG. 1 and FIG. 8, it is possible to shorten a length of the peripheral region PF1 in the Y direction. Thus, it is possible to suppress an increase in the length of the non-display region NDA in the Y direction even when the peripheral region PF2 of the substrate SUB2 is arranged so as to cover the peripheral region PF1 of the substrate SUB1.

In addition, since a large number of the terminal groups TMG2, TMG3, and TMG4 are arranged in the vicinity of the terminal group TMG1 in the case of the display device DSP2 as shown in FIG. 11, the arrangement density of conductor patterns is increased as compared with the display device DSP1 shown in FIG. 6. However, as shown in FIG. 10, each of the terminal groups TMG1, TMG3, and TMG4 is arranged at positions facing the direction different from the front surface 10f of the substrate 10 in the display region DA. Further, the terminal group TMG2 is arranged at a position facing the direction different from the back surface 20b of the substrate in the display region DA. Therefore, the high arrangement density of conductor patterns in the vicinity of the terminal group TMG1 shown in FIG. 11 does not cause an increase in the area of the non-display region NDA.

In addition, as shown in FIG. 10, the terminal group TMG2 arranged on the curved surface and the terminal group TMG4 arranged on the curved surface are electrically connected via the anisotropic conductive film ACF1 in the case of the display device DSP2. The anisotropic conductive film ACF1 freely deforms in conformity to a shape of the surface to be attached. Therefore, even in the case where the terminal group TMG2 and the terminal group TMG4 are arranged on the curved surfaces as in the display device DSP2, it is possible to improve the connection reliability.

Also, as shown in FIG. 10, the peripheral region PF2 of the substrate SUB2 is arranged so as to surround the peripheral region PF1 of the substrate SUB1. Thus, a length of the wiring WR2 formed along the back surface 20b of the substrate 20 is greater than a length of the wiring WR1 (see FIG. 8) formed along the front surface 10f of the substrate 10. Specifically, the plurality of pixel electrodes PE (see FIG. 4) of the display device DSP2 are electrically connected to the terminal group TMG1 via the wiring WR1 on the front surface 10f, and the plurality of detection electrodes TSE (see FIG. 10) are electrically connected to the terminal group TMG2 via the wiring WR2 on the back surface 20b. A path distance of the wiring WR1 from the position where the wiring WR1 overlaps the adhesive BND to the terminal group TMG1 on the front surface 10f is shorter than a path distance of the wiring WR2 from the position where the wiring WR2 overlaps the adhesive BND to the terminal group TMG2 on the back surface 20b.

Since the signal transmission path for supplying the image signal Spic to the pixel electrode PE shown in FIG. 4 becomes longer as compared with the signal transmission path connected to the detection electrode TSE shown in FIG. 5, the signal quality is likely to be relatively deteriorated. Thus, it is preferable to shorten the path distance of the wiring WR1 including the signal connection wiring SCL from the viewpoint that it is possible to suppress the deterioration of the signal quality of the image signal Spic.

Note that there is also a case where the length of the wiring WR1 becomes greater than the length of the wiring WR2 depending on the length of the wiring WR3 shown in FIG. 10. In the case of the structure of the display device DSP2, however, the path distance of the wiring WR1 from the position where the wiring WR1 overlaps the adhesive BND to the terminal group TMG1 on the front surface 10f is shorter than at least a total value of the path distance of the wiring WR2 from the position where the wiring WR2 overlaps the adhesive BND to the terminal group TMG2 and the path distance of the wiring WR3 on the back surface 20b.

Figure 14:
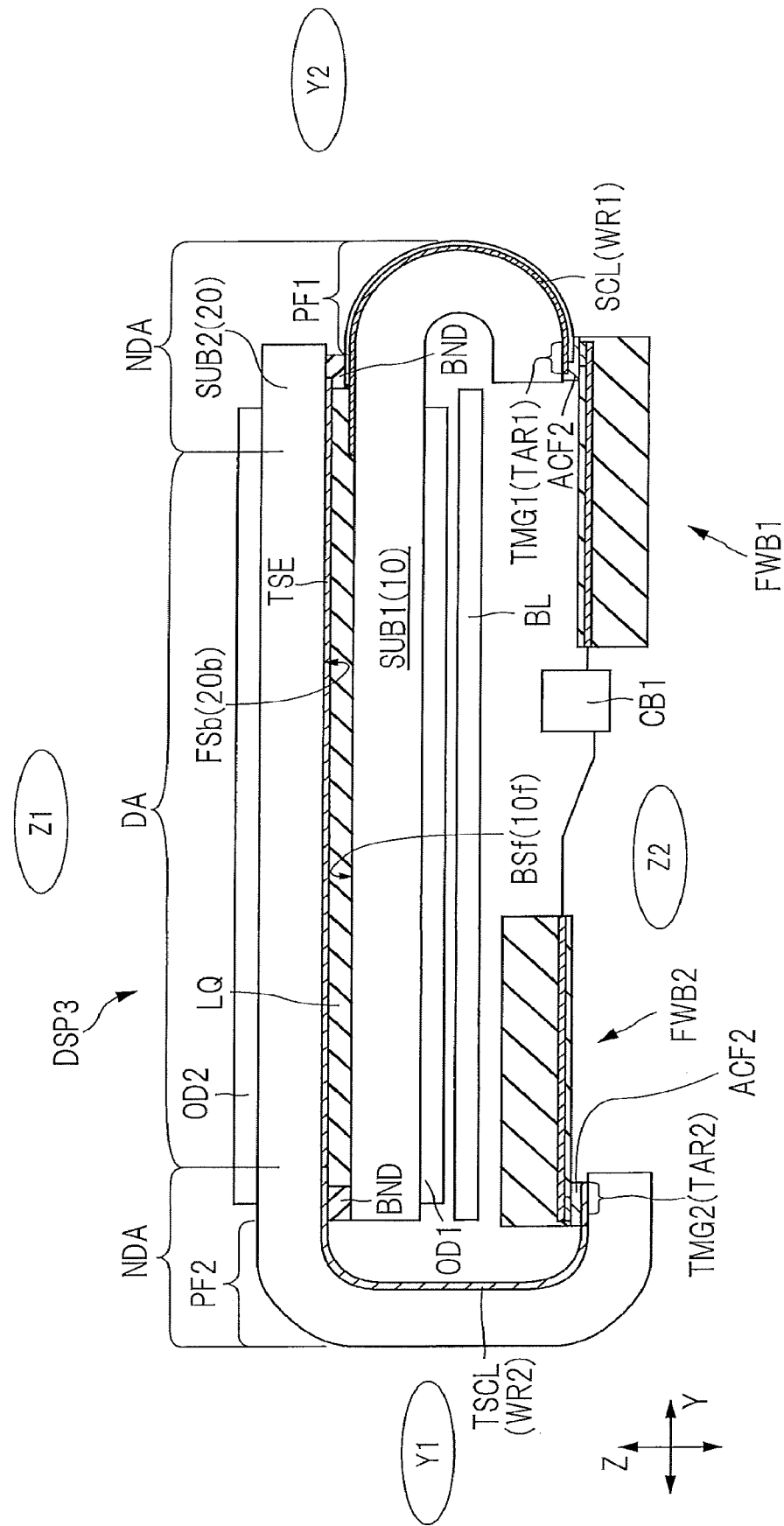
FIG. 14 is a cross-sectional view of a detection electrode and a wiring connected to the detection electrode shown in FIG. 12 taken along a wiring path.

In addition, as shown in FIG. 14, the cover member CVM shown in FIG. 2 is not attached in the case of the display device DSP2. However, the cover member CVM shown in FIG. 2 may be arranged on the Z1 side of the substrate SUB2 shown in FIG. 14 as a modification of the display device DSP2. Also, the display device DSP2 shown in FIGS. 8 to 11 is similar to the display device DSP1 shown in FIG. 1 except for the above-described difference. Therefore, the redundant description will be omitted.

<Modification 2>

Figure 12:
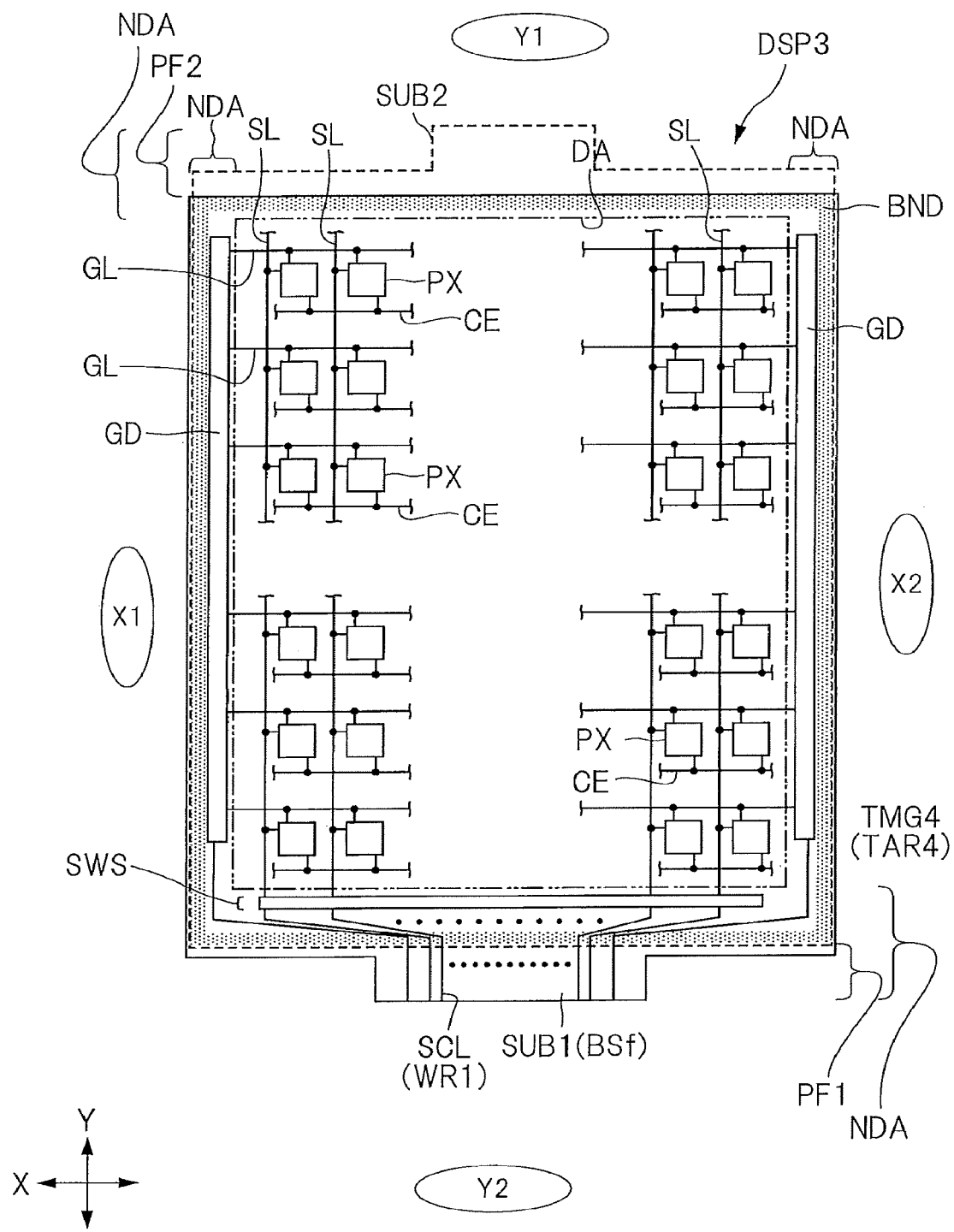
FIG. 12 is a plan view of a display device which is another modification with respect to FIG. 1.
Figure 13:
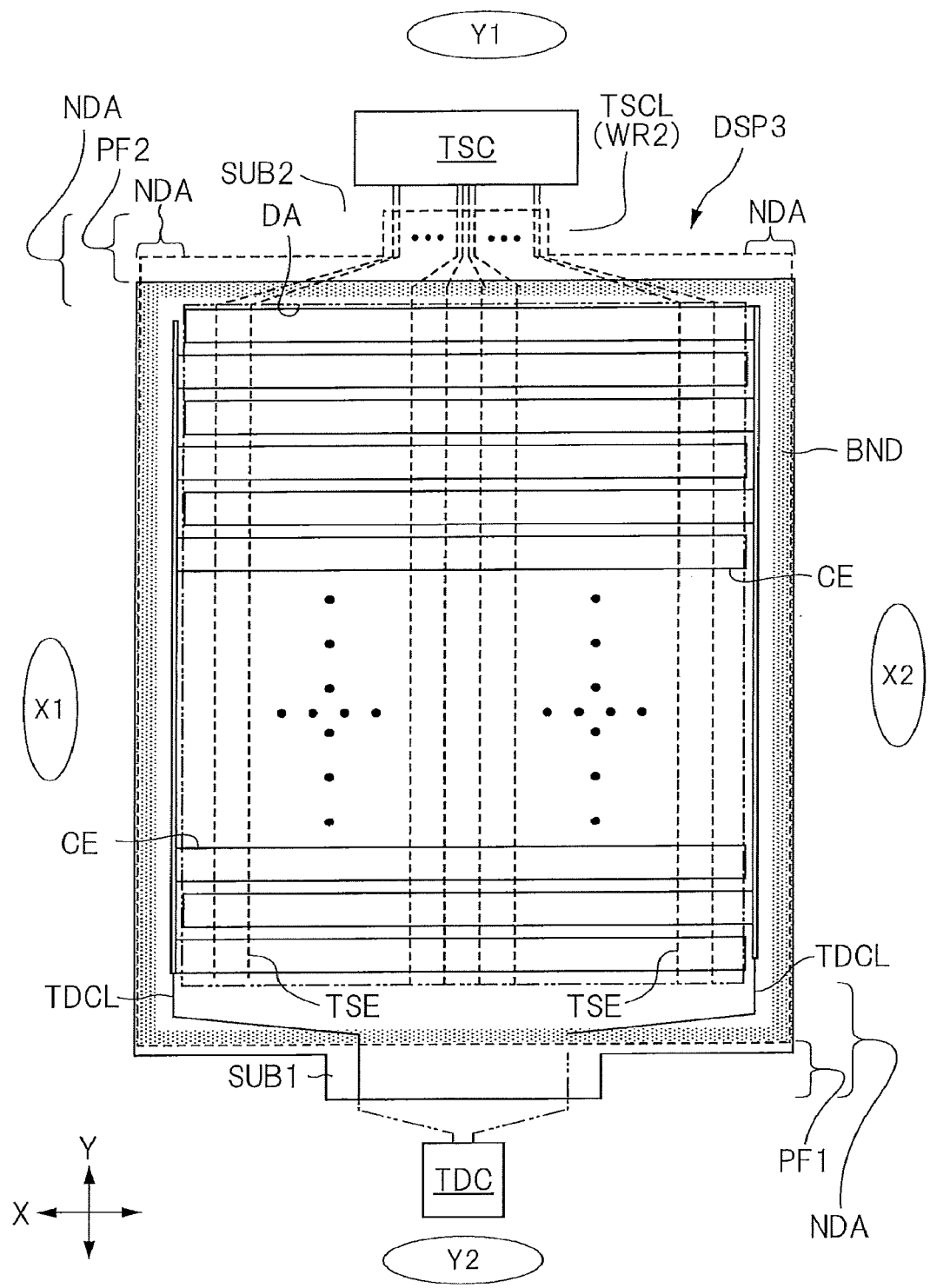
FIG. 13 is a plan view showing an example of a circuit configuration of a touch sensor provided in the display device shown in FIG. 12.

Next, an example in which the peripheral region PF1 of the substrate SUB1 and the peripheral region PF2 of the substrate SUB2 are bent at positions where the peripheral regions PF1 and PF2 are not overlapped with each other. FIG. 12 is a plan view of a display device which is another modification with respect to FIG. 1. FIG. 13 is a plan view showing an example of a circuit configuration of a touch sensor provided in the display device shown in FIG. 12. Also, FIG. 14 is a cross-sectional view of a detection electrode and a wiring connected to the detection electrode shown in FIG. 12 taken along a wiring path.

A display device DSP3 shown in FIGS. 12 to 14 is different from the display device DSP1 shown in FIG. 2 and the display device DSP2 shown in FIG. 8 in that the substrate SUB1 and the substrate SUB2 are bent at positions on opposite sides in the Y direction as shown in FIG. 14. As shown in FIGS. 12 and 13, the peripheral region PF1 of the substrate SUB1 is disposed on the Y2 side in the Y direction and the peripheral region PF2 of the substrate SUB2 is disposed on the Y1 side in the Y direction. In other words, the display region DA of the display device DSP3 is disposed between the peripheral region PF1 and the peripheral region PF2 in a plan view. Also, the peripheral region PF1 of the substrate SUB1 and the peripheral region PF2 of the substrate SUB2 do not oppose each other.

In addition, in the case of the display device DSP3, a signal transmission path formed on the substrate SUB1 is provided on the Y2 side as shown in FIG. 12. On the other hand, a signal transmission path formed on the substrate SUB2 is provided on the Y1 side as shown in FIG. 13. Thus, the portion where the substrate SUB1 and the substrate SUB2 are electrically connected is not present on the display surface side of the substrate SUB1 (Z1 side in the Z direction shown in FIG. 14). The plurality of wirings WR1 including the signal connection wiring SCL connected to the pixel electrode PE (see FIG. 4) are connected to the wiring board FWB1 on the Z2 side of the backlight unit BL. In addition, the wiring WR2 including the wiring TSCL connected to the detection electrode TSE is connected to a wiring board FWB2 on the Z2 side of the backlight unit BL. Further, in the example shown in FIG. 14, each of the wiring board FWB1 and the wiring board FWB2 is connected to the circuit board CB1.

Since the wiring WR1 of the substrate SUB1 and the wiring WR2 of the substrate SUB2 are led out in respectively different directions as in the display device DSP3, it is possible to further simplify a layout of the wiring WR1 and the wiring WR2 as compared with the display device DSP2 described with reference to FIGS. 8 to 11. Namely, as shown in FIG. 12, the plurality of wirings WR1 led out to the peripheral region PF1 of the substrate SUB1 are integrated in a central region in the X direction. In addition, as shown in FIG. 13, the plurality of wirings WR2 led out to the peripheral region PF2 of the substrate SUB2 are integrated in a central region in the X direction. When the plurality of wirings WR1 are integrated in a partial region in the X direction, a length (width) of a portion to be bent of the substrate SUB1 in the X direction can be reduced, and it is thus possible to easily carry out a bending process. Similarly, when the plurality of wirings WR2 are integrated in a partial region in the X direction, a length (width) of a portion to be bent of the substrate SUB2 in the X direction can be reduced, and it is thus possible to easily carry out a bending process.

In addition, since the wiring board FWB1 and the wiring board FWB2 are connected to the substrate SUB1 and the substrate SUB2, respectively, in the case of the display device DSP3, the terminal groups TMG3 and TMG4 shown in FIGS. 1 and 6 or FIGS. 8 and 11 are not provided. As shown in FIG. 14, the terminal group TMG2 of the display device DSP3 is connected to the terminal of the wiring board FWB2 via the anisotropic conductive film ACF2. In this manner, it is possible to reduce the number of terminals in the case of the display device DSP3 as compared with the display device DSP1 and the display device DSP2 described above.

As described above, the signal transmission path for supplying the image signal Spic to the pixel electrode PE shown in FIG. 4 becomes longer as compared with the signal transmission path connected to the detection electrode TSE shown in FIG. 5, so that the signal quality is likely to be relatively deteriorated. Therefore, in the case of the display device DSP3, a path distance from the terminal group TMG1 to the circuit board CB1 is shorter than a path distance from the terminal group TMG2 to the circuit board CB1. Specifically, a wiring path distance of the wiring board FWB1 that electrically connects the terminal group TMG1 and the circuit board CB1 is shorter than a wiring path distance of the wiring board FWB2 that electrically connects the terminal group TMG2 and the circuit board CB1.

Figure 15:
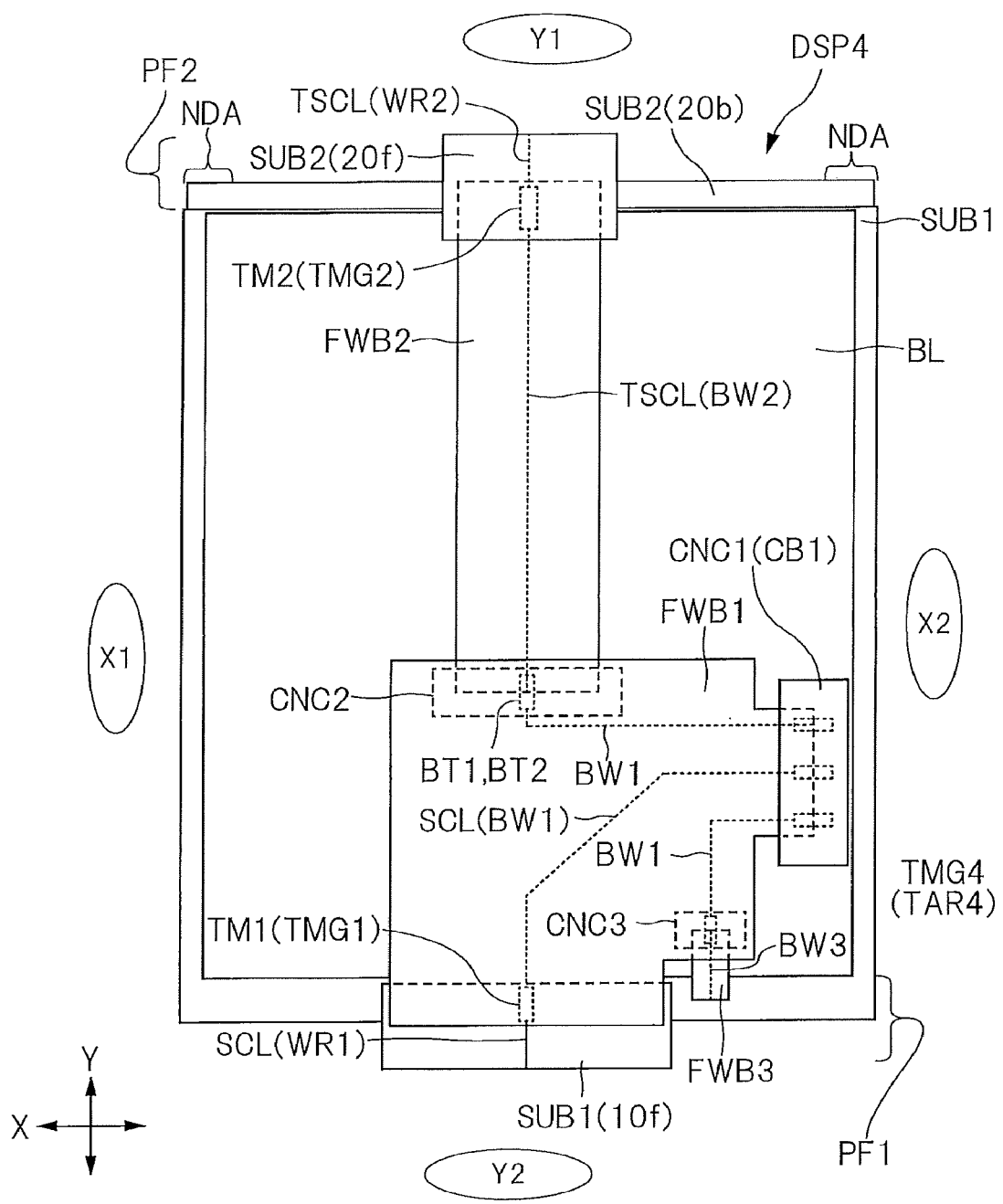
FIG. 15 is a plan view showing an example of a layout of a wiring board on a back surface side of a display device which is a modification with respect to FIG. 14.
Figure 16:
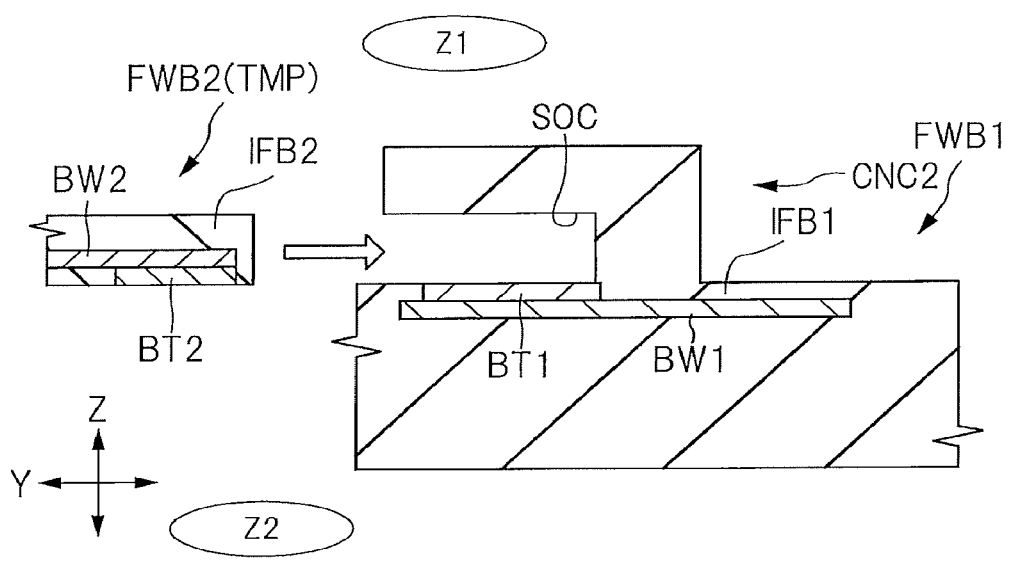
FIG. 16 is an enlarged cross-sectional view showing a structural example of a connector shown in FIG. 15.
Figure 17:
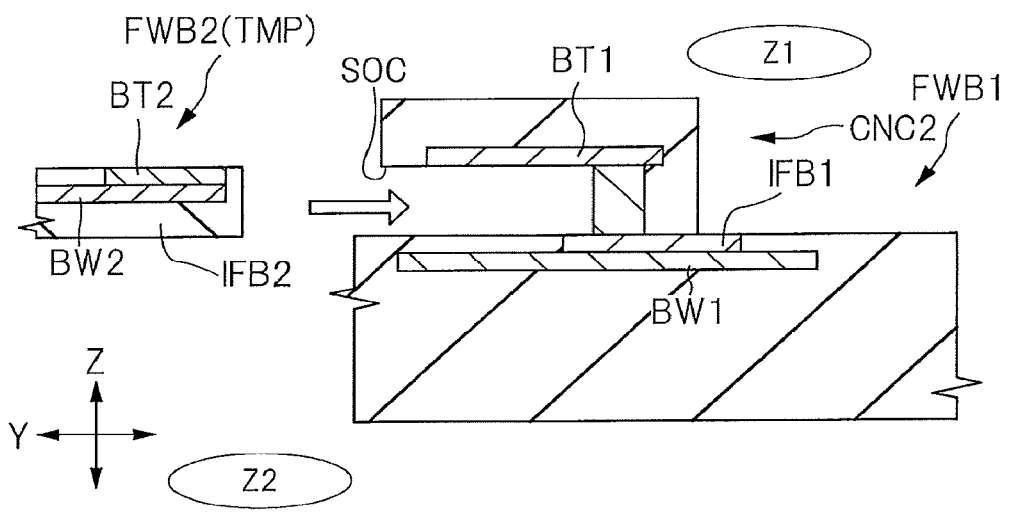
FIG. 17 is an enlarged cross-sectional view showing another structural example of the connector shown in FIG. 15.

In addition, in the case of the display device DSP3 shown in FIG. 14, the wiring board FWB1 and the wiring board FWB2 are not directly connected, but are connected to the circuit board CB1. As a modification with respect to the display device DSP3, however, the wiring board FWB1 and the wiring board FWB2 may be connected to each other as in a display device DSP4 shown in FIG. 15. FIG. 15 is a plan view showing an example of a layout of a wiring board on a back surface side of a display device which is a modification with respect to FIG. 14. FIGS. 16 and 17 are enlarged cross-sectional views showing a structural example of a connector shown in FIG. 15.

The display device DSP4 shown in FIG. 15 is different from the display device DSP3 shown in FIGS. 12 to 14 in a connection structure of the wiring board FWB1 and the wiring board FWB2. In the display device DSP4, the wiring board FWB1 and the wiring board FWB2 are connected to each other. Each of a plurality of signal transmission paths provided in the display device DSP4 is integrated in a part of the wiring board FWB1 and connected to a connector CNC3 of the circuit board CB1. Note that the display device DSP4 has the structure similar to that of the display device DSP3 shown in FIGS. 12 to 14 except for the connection structure of the wiring boards FWB1 and FWB2 described above. Therefore, as shown in FIG. 15, the terminal group TMG1 is connected to the wiring board FWB1, and the terminal group TMG2 is connected to the wiring board FWB2.

By integrating the plurality of signal transmission paths at one place as in the display device DSP4, it is possible to reduce the number of the connectors CNC1 on the circuit board CB1 side. As a result, it is possible to improve a degree of freedom in a circuit layout in the circuit board CB1. Although only the connector CNC1 of the circuit board CB1 is shown in FIG. 15, the main body portion of the circuit board CB1 can be arranged at any arbitrary position on the back surface side of the backlight unit BL.

In addition, in the case of the display device DSP4, the wiring board FWB2 is connected to a connector CNC2 of the wiring board FWB1. Specifically, as shown in FIG. 16, the connector CNC2 of the wiring board FWB1 has a socket (accommodating portion or opening) SOC to accommodate a part (terminal portion TMP) of the wiring board FWB2. Also, a terminal BT1 electrically connected to a wiring BW1 of the wiring board FWB1 is exposed from an insulating film IFB1 on an inner surface of the socket SOC. On the other hand, the terminal portion (distal end portion) TMP of the wiring board FWB2 has a terminal BT2 connected to a wiring BW2 of the wiring board FWB2 and exposed from an insulating film IFB2. As schematically indicated by an arrow in FIG. 16, when the terminal portion IMP of the wiring board FWB2 is inserted into the socket SOC of the wiring board FWB1, the terminal BT1 of the wiring board FWB1 and the terminal BT2 of the wiring board FWB2 are electrically connected to each other. The method of electrically connecting the terminal BT1 and the terminal BT2 may be a method of directly press-bonding these terminals BT1 and BT2 or a method of interposing another conductive member between the terminals BT1 and BT2.

Also, although an example in which the terminal BT2 of the wiring board FWB2 is exposed on the Z2 side of the insulating film IFB2 in the Z direction has been described in FIG. 16, the terminal BT2 of the wiring board FWB2 may be exposed on the Z2 side of the insulating film IFB2 in the Z direction as shown in FIG. 17. If the terminal BT1 is arranged at a position opposing the terminal BT2 of the wiring board FWB2 when the terminal portion TMP of the wiring board FWB2 is inserted into the socket SOC, it is possible to electrically connect the terminal BT1 and the terminal BT2.

In addition, as shown in FIG. 15, a path distance from the terminal group TMG1 to the circuit board CB1 (extending distance of the wiring BW1 connected to the terminal TM1 in FIG. 15) is shorter than a path distance from the terminal group TMG2 to the circuit board CB1 (total value of an extending distance of the wiring BW2 in FIG. 15 and an extending distance of the wiring BW1 connected to the wiring BW2) also in the case of the display device DSP4. Thus, it is possible to suppress the deterioration of signal quality of the signal transmission path for supplying the image signal Spic to the pixel electrode PE shown in FIG. 4.

In addition, as shown in FIG. 10, the peripheral region PF2 of the substrate SUB2 is arranged so as to surround the peripheral region PF1 of the substrate SUB1. Thus, a length of the wiring WR2 formed along the back surface 20b of the substrate 20 is greater than a length of the wiring WR1 (see FIG. 8) formed along the front surface 10f of the substrate 10. Specifically, the plurality of pixel electrodes PE (see FIG. 4) of the display device DSP2 are electrically connected to the terminal group TMG1 via the wiring WR1 on the front surface 10f, and the plurality of detection electrodes TSE (see FIG. 10) are electrically connected to the terminal group TMG2 via the wiring WR2 on the back surface 20b. A path distance of the wiring WR1 from the position where the wiring WR1 overlaps the adhesive BND to the terminal group TMG1 on the front surface 10f is shorter than a path distance of the wiring WR2 from the position where the wiring WR2 overlaps the adhesive BND to the terminal group TMG2 on the back surface 20b.

In addition, in the example shown in FIG. 15, a wiring board FWB3 is connected to the wiring board FWB1 via a connector CNC3. The wiring board FWB3 is connected to the backlight unit BL, and a signal to control the driving of the backlight unit is transmitted to the wiring board FWB3. For example, a circuit to control the backlight unit BL is formed on the circuit board CB1 and is electrically connected to the backlight unit BL via the wiring BW1 of the wiring board FWB1 and the wiring BW3 of the wiring board FWB3. Since a structure of the connector CNC3 and a structure of the connector CNC1 shown in FIG. 15 are similar to that of the connector CNC2, the redundant description will be omitted. In addition, the display device DSP3 shown in FIGS. 12 to 14 and the display device DSP4 shown in FIG. 15 are similar to the display device DSP2 described with reference to FIGS. 8 to 11 except for the above-described differences. Therefore, the redundant description will be omitted.

<Other Modifications>

The technique described above can be applied to various modifications in addition to the embodiment and the plurality of modifications that have been already described. For example, in the description with reference to FIG. 5, the detection electrode TSE for touch detection is taken as the electrode formed on the substrate SUB2. However, there are various modifications regarding the electrode to be formed on the substrate SUB2. For example, although the case where the common electrode CE is used as a drive electrode for touch detection has been described in FIG. 5, the drive electrode for touch detection may be formed on the substrate SUB2. In addition, there is also a case where a drive signal for touch detection is applied to the detection electrode TSE itself shown in FIG. 5. Further, even in the case of a display device in which a touch sensor is not incorporated, the above-described technique can be applied when an electrode is formed on the substrate SUB2 and the electrode is electrically connected to a circuit outside the substrate SUB2.

In addition, the example in which the peripheral region PF1 and the peripheral region PF2 are led out along the Y direction which is an extending direction of the signal line SL has been described in the case of the display device DSP2 shown in FIG. 8 and the display device DSP3 shown in FIG. 12. However, the direction in which the peripheral region PF1 and the peripheral region PF2 are led out is not limited to the Y direction, and the peripheral region PF1 and the peripheral region PF2 may be led out in the X direction shown in FIGS. 8 and 9. For example, when each of the plurality of detection electrodes TSE shown in FIGS. 9 and 13 extends in the X direction, it is possible to reduce the wiring distance of the wiring TSCL as long as the peripheral region PF2 where the wiring TSCL connected to the detection electrode TSE is formed is led out in the X direction.

It is understood that a person skilled in the art can derive various kinds of modifications and corrections in the range of the idea of the present invention, and these modifications and corrections are encompassed within the scope of the present invention. For example, the embodiments obtained by performing addition or elimination of components or design change or the embodiments obtained by performing addition or reduction of process or condition change to the embodiments described above by a person skilled in the art are also included in the scope of the present invention as long as they include the gist of the present invention.

The present invention can be utilized for a display device or electronic equipment in which a display device is incorporated.

What is claimed is:

1. A display device comprising:
a flexible first substrate having a first A-surface;
a second substrate having a second A-surface opposing the first A-surface and adhered to the first substrate via an adhesive;
an electro-optical layer disposed between the first A-surface of the first substrate and the second A-surface of the second substrate;
a plurality of pixel electrodes disposed between the first substrate and the electro-optical layer;
a first terminal group disposed on a first A-surface side and electrically connected to the plurality of pixel electrodes;

a plurality of first electrodes disposed between the second substrate and the electro-optical layer;

a second terminal group disposed on a second A-surface side and electrically connected to the plurality of first electrodes;

a display region disposed on each of the first substrate and the second substrate and overlapping the electro-optical layer; and a peripheral region disposed on each of the first substrate and the second substrate and located on an outer side of the electro-optical layer and the adhesive, wherein the first terminal group is formed in a first terminal arrangement region of a first peripheral region which is the peripheral region of the first substrate, the second terminal group is formed in a second terminal arrangement region of a second peripheral region which is the peripheral region of the second substrate, the display region is disposed between the first peripheral region and the second peripheral region in a plan view, or the first peripheral region and the second peripheral region are overlapped with each other, the first substrate and the second substrate are arranged in a first direction, and the first peripheral region is bent toward one side in the first direction.

2. The display device according to claim 1, further comprising:
a cover member opposing a second B-surface on an opposite side of the second A-surface of the second substrate,
wherein the second substrate is disposed between the cover member and the first substrate in the first direction.

3. The display device according to claim 2,
wherein the first peripheral region and the second peripheral region do not oppose each other.

4. The display device according to claim 1,
wherein the first peripheral region and the second peripheral region oppose each other.

5. The display device according to claim 4, further comprising:
a third terminal group; and
a fourth terminal group electrically connected to the third terminal group,
wherein the first terminal group is formed in the first terminal arrangement region of the first peripheral region of the first substrate,
the second terminal group is formed in the second terminal arrangement region of the second peripheral region of the second substrate,
the second terminal arrangement region opposes the first peripheral region,
the third terminal group is formed in a third terminal arrangement region of the first peripheral region on the first A-surface of the first substrate,
the fourth terminal group is formed in a fourth terminal arrangement region, which opposes the second terminal arrangement region of the second substrate, on the first A-surface of the first substrate, and
the fourth terminal group is electrically connected to the second terminal group via an anisotropic conductive film.

6. The display device according to claim 1,
wherein the plurality of pixel electrodes are electrically connected to the first terminal group via a first wiring on the first A-surface, the plurality of first electrodes are electrically connected to the second terminal group via a second wiring on the second A-surface, and a path distance of the first wiring from a position where the first wiring overlaps the adhesive to the first terminal group on the first A-surface is shorter than a path distance of the second wiring from a position where the second wiring overlaps the adhesive to the second terminal group on the second A-surface.

7. The display device according to claim 1,
wherein the first terminal group is connected to a first wiring board,
the second terminal group is connected to a second wiring board, and
the first wiring board and the second wiring board are connected to each other.

8. The display device according to claim 7,
wherein the first terminal group and the second terminal group are connected to a circuit board, and
a path distance from the first terminal group to the circuit board is shorter than a path distance from the second terminal group to the circuit board.

9. The display device according to claim 1,
wherein the first terminal group is formed in the first terminal arrangement region of the first peripheral region of the first substrate,
the second terminal group is formed in the second terminal arrangement region of the second peripheral region of the second substrate,
the display region and the second peripheral region of the second substrate are arranged in a second direction,
a length of the second terminal arrangement region is shorter than a length of the display region in a third direction intersecting the second direction,
the second peripheral region has a first-side region, a second-side region opposite to the first-side region, and a central region between the first-side region and the second-side region in the third direction, and
the second terminal arrangement region is disposed in the first-side region.

10. The display device according to claim 1,
wherein the first terminal group is formed in the first terminal arrangement region of the first peripheral region of the first substrate,
the second terminal group is formed in the second terminal arrangement region of the second peripheral region of the second substrate,
the display region and the first peripheral region of the first substrate are arranged in a second direction,
a length of the first terminal arrangement region is shorter than a length of the display region in a third direction intersecting the second direction,
the first peripheral region has a first-side region, a second-side region opposite to the first-side region, and a central region between the first-side region and the second-side region in the third direction, and
the first terminal arrangement region is disposed in the central region.

11. The display device according to claim 1,
wherein the first peripheral region and the second peripheral region do not oppose each other.

12. The display device according to claim 11,
wherein the display region is disposed between the first peripheral region and the second peripheral region in a plan view.

13. The display device according to claim 11,
wherein the first terminal group and the second terminal group are connected to a circuit board, and
a path distance from the first terminal group to the circuit board is shorter than a path distance from the second terminal group to the circuit board.

14. A display device comprising:
a flexible first substrate having a first A-surface;
a flexible second substrate having a second A-surface opposing the first A-surface and adhered to the first substrate via an adhesive;
an electro-optical layer disposed between the first A-surface of the first substrate and the second A-surface of the second substrate;
a plurality of pixel electrodes disposed between the first substrate and the electro-optical layer;
a first terminal group disposed on a first A-surface side and electrically connected to the plurality of pixel electrodes;
a plurality of first electrodes disposed between the second substrate and the electro-optical layer;
a second terminal group disposed on a second A-surface side and electrically connected to the plurality of first electrodes;
a display region disposed on each of the first substrate and the second substrate and overlapping the electro-optical layer;
a peripheral region disposed on each of the first substrate and the second substrate and located on an outer side of the electro-optical layer and the adhesive; and
a first wiring board electrically connected to the first terminal group,
wherein the first terminal group is formed in a first peripheral region which is the peripheral region of the first substrate,
the second terminal group is formed in a second peripheral region which is the peripheral region of the second substrate,
the second terminal group is electrically connected to the first wiring board via an anisotropic conductive film,
the first substrate and the second substrate are arranged in a first direction, and
the first peripheral region is bent toward one side in the first direction.

15. The display device according to claim 14, further comprising:
a cover member opposing a second B-surface on an opposite side of the second A-surface of the second substrate,
wherein the second substrate is disposed between the cover member and the first substrate in the first direction.

16. The display device according to claim 14,
wherein the first peripheral region and the second peripheral region oppose each other.

17. The display device according to claim 16, further comprising:
a third terminal group; and
a fourth terminal group electrically connected to the third terminal group,
wherein the first terminal group is formed in a first terminal arrangement region of the first peripheral region of the first substrate,
the second terminal group is formed in a second terminal arrangement region of the second peripheral region of the second substrate,
the second terminal arrangement region opposes the first peripheral region,
the third terminal group is formed in a third terminal arrangement region of the first peripheral region on the first A-surface of the first substrate,
the fourth terminal group is formed in a fourth terminal arrangement region, which opposes the second terminal arrangement region of the second substrate, on the first A-surface of the first substrate, and
the fourth terminal group is electrically connected to the second terminal group via an anisotropic conductive film.

18. The display device according to claim 14,
wherein the plurality of pixel electrodes are electrically connected to the first terminal group via a first wiring on the first A-surface,
the plurality of first electrodes are electrically connected to the second terminal group via a second wiring on the second A-surface, and
a path distance of the first wiring from a position where the first wiring overlaps the adhesive to the first terminal group on the first A-surface is shorter than a path distance of the second wiring from a position where the second wiring overlaps the adhesive to the second terminal group on the second A-surface.

19. The display device according to claim 14,
wherein the first terminal group is formed in a first terminal arrangement region of the first peripheral region of the first substrate,
the second terminal group is formed in a second terminal arrangement region of the second peripheral region of the second substrate,
the display region and the second peripheral region of the second substrate are arranged in a second direction,
a length of the second terminal arrangement region is shorter than a length of the display region in a third direction intersecting the second direction,
the second peripheral region has a first-side region, a second-side region opposite to the first-side region, and a central region between the first-side region and the second-side region in the third direction, and
the second terminal arrangement region is disposed in the first-side region.

20. The display device according to claim 14,
wherein the first terminal group is formed in a first terminal arrangement region of the first peripheral region of the first substrate,
the second terminal group is formed in a second terminal arrangement region of the second peripheral region of the second substrate,
the display region and the first peripheral region of the first substrate are arranged in a second direction,
a length of the first terminal arrangement region is shorter than a length of the display region in a third direction intersecting the second direction,
the first peripheral region has a first-side region, a second-side region opposite to the first-side region, and a central region between the first-side region and the second-side region in the third direction, and
the first terminal arrangement region is disposed in the central region.

* * * * *